US010705994B2

(12) United States Patent
Qiu et al.

(10) Patent No.: US 10,705,994 B2
(45) Date of Patent: Jul. 7, 2020

(54) UNIFIED CACHE FOR DIVERSE MEMORY TRAFFIC

(71) Applicant: NVIDIA Corporation, Santa Clara, CA (US)

(72) Inventors: Xiaogang Qiu, San Jose, CA (US); Ronny Krashinsky, San Francisco, CA (US); Steven Heinrich, Madison, AL (US); Shirish Gadre, Fremont, CA (US); John Edmondson, Arlington, MA (US); Jack Choquette, Palo Alto, CA (US); Mark Gebhart, Round Rock, TX (US); Ramesh Jandhyala, Austin, TX (US); Poornachandra Rao, Cedar Park, TX (US); Omkar Paranjape, Austin, TX (US); Michael Siu, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 208 days.

(21) Appl. No.: 15/587,213

(22) Filed: May 4, 2017

(65) Prior Publication Data

US 2018/0322077 A1 Nov. 8, 2018

(51) Int. Cl.
| G06F 12/084 | (2016.01) |
| G06F 13/28 | (2006.01) |
| G06F 12/0891 | (2016.01) |
| G06F 12/0811 | (2016.01) |
| G06F 12/0895 | (2016.01) |

(Continued)

(52) U.S. Cl.
CPC ............ *G06F 13/28* (2013.01); *G06F 12/084* (2013.01); *G06F 12/0811* (2013.01); *G06F 12/0891* (2013.01); *G06F 12/0895* (2013.01); *G06F 12/122* (2013.01); *G06F 2212/60* (2013.01); *G06F 2212/62* (2013.01); *G06F 2213/28* (2013.01); *G11C 7/1015* (2013.01)

(58) Field of Classification Search
CPC ..... G06F 12/084; G06F 12/84; G06F 12/0895
See application file for complete search history.

(56) References Cited

U.S. PATENT DOCUMENTS

| 5,721,874 A | 2/1998 | Carnevale et al. |
| 5,918,248 A | 6/1999 | Newell et al. |

(Continued)

*Primary Examiner* — Farley Abad
(74) *Attorney, Agent, or Firm* — Artegis Law Group, LLP

(57) ABSTRACT

A unified cache subsystem includes a data memory configured as both a shared memory and a local cache memory. The unified cache subsystem processes different types of memory transactions using different data pathways. To process memory transactions that target shared memory, the unified cache subsystem includes a direct pathway to the data memory. To process memory transactions that do not target shared memory, the unified cache subsystem includes a tag processing pipeline configured to identify cache hits and cache misses. When the tag processing pipeline identifies a cache hit for a given memory transaction, the transaction is rerouted to the direct pathway to data memory. When the tag processing pipeline identifies a cache miss for a given memory transaction, the transaction is pushed into a first-in first-out (FIFO) until miss data is returned from external memory. The tag processing pipeline is also configured to process texture-oriented memory transactions.

20 Claims, 18 Drawing Sheets

(51) Int. Cl.
    *G06F 12/122*     (2016.01)
    *G11C 7/10*     (2006.01)

(56) References Cited

U.S. PATENT DOCUMENTS

| | | | |
|---|---|---|---|
| 6,493,800 B1 | 12/2002 | Blumrich | |
| 7,246,203 B2 * | 7/2007 | Moat | G06F 12/0862 |
| | | | 711/133 |
| 7,984,202 B2 * | 7/2011 | Hofmann | G06F 13/1621 |
| | | | 710/22 |
| 2002/0174299 A1 * | 11/2002 | Hayter | G06F 12/0888 |
| | | | 711/118 |
| 2018/0189182 A1 | 7/2018 | Wang et al. | |

\* cited by examiner

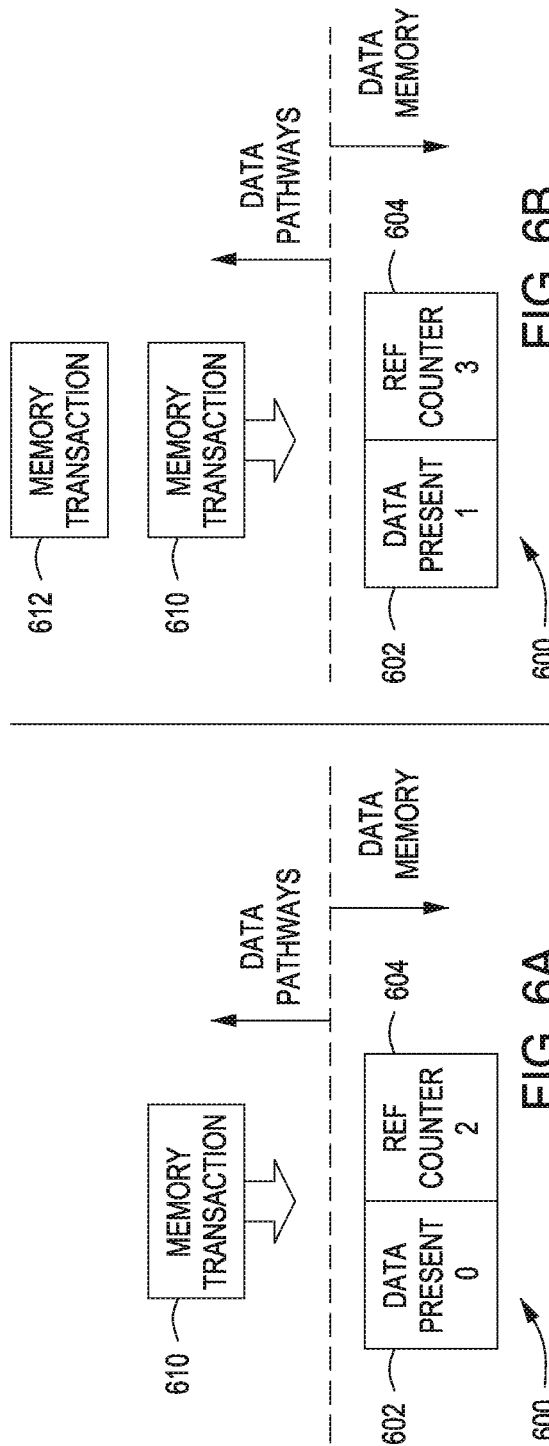
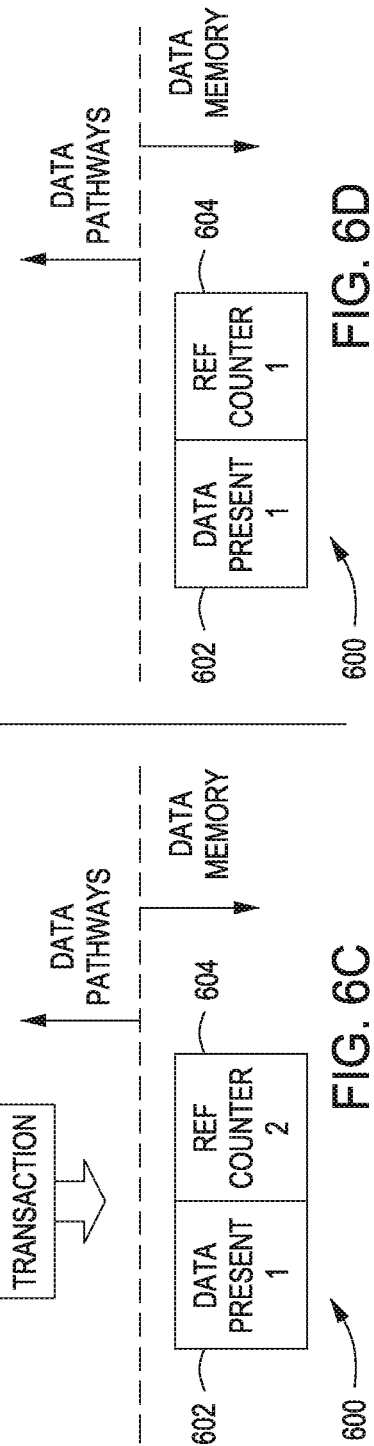

UNIFIED CACHE FOR DIVERSE MEMORY TRAFFIC

BACKGROUND OF THE INVENTION

Field of the Invention

Embodiments of the present invention relate generally to processing memory transactions and, more specifically, to a unified cache for diverse memory traffic.

Description of the Related Art

A conventional graphics processor includes a collection of processing cores. Each processing core may perform memory transactions with main memory and cache associated data in a level one (L1) cache. Typically, a tag store manages the data stored in the L1 cache.

Each processing core in a conventional graphics processor may include a texture processing pipeline. The texture processing pipeline reads textures from memory, performs various operations with those textures, and then maps the processed textures to graphics objects. Texture processing pipelines may cache texture data in a texture cache. The texture cache is usually coupled to some form of tag store for managing the texture data, similar to the tag store mentioned above in relation to the L1 cache.

In addition to the L1 cache and the texture cache described above, a processing core within a conventional graphics processor may also include a scratchpad memory that allows parallel threads executing on the processing core to temporarily store data. The scratchpad memory may also provide a communication channel that allows threads to exchange data with one another.

As a general matter, conventional parallel processors include a number of different memory areas designed for different purposes, as described above. This distributed architecture is inefficient because each memory area requires similar logic, resulting in duplicate tag stores and/or duplicate crossbars. One approach to solving this problem involves combining the shared memory and the L1 cache. Another approach involves combining the L1 cache and the texture cache. However, both of these approaches still require distributed memory areas and duplicate logic.

As the foregoing illustrates, what is needed in the art is a more effective cache subsystem architecture.

SUMMARY OF THE PRESENT INVENTION

One embodiment of the present invention sets forth a memory subsystem, including a first memory, a first data pathway that services first-type memory transactions and provides direct access to the first memory, and a second data pathway that services second-type memory transactions of a first sub-type and second-type memory transactions of a second sub-type. The second data pathway includes a first data sub-pathway that is coupled to the first data pathway and directs second-type memory transactions of the first sub-type to the first data pathway, and a second data sub-pathway that is coupled to the first memory and services second-type memory transactions of the second sub-type.

One advantage of the unified cache subsystem is that the tag processing pipeline includes just one tag store that is utilized when processing global memory operations and when processing texture memory operations. Thus, the duplicate tag store found in prior art designs is eliminated. Another advantage of the unified cache subsystem is that the data memory includes only one crossbar for reading out data, compared to two crossbars required by prior designs. Yet another advantage of the unified cache subsystem is that the tag processing pipeline performs memory address translation. Thus, memory transactions targeting global memory need not traverse the entire texture processing pipeline to perform those translations.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 6A-6D are conceptual diagrams of a set of memory transactions that target the same data within the unified cache of FIG. 4, according to various embodiments of the present invention;

DETAILED DESCRIPTION

In the following description, numerous specific details are set forth to provide a more thorough understanding of the present invention. However, it will be apparent to one of skill in the art that the present invention may be practiced without one or more of these specific details.

System Overview

Figure 1:
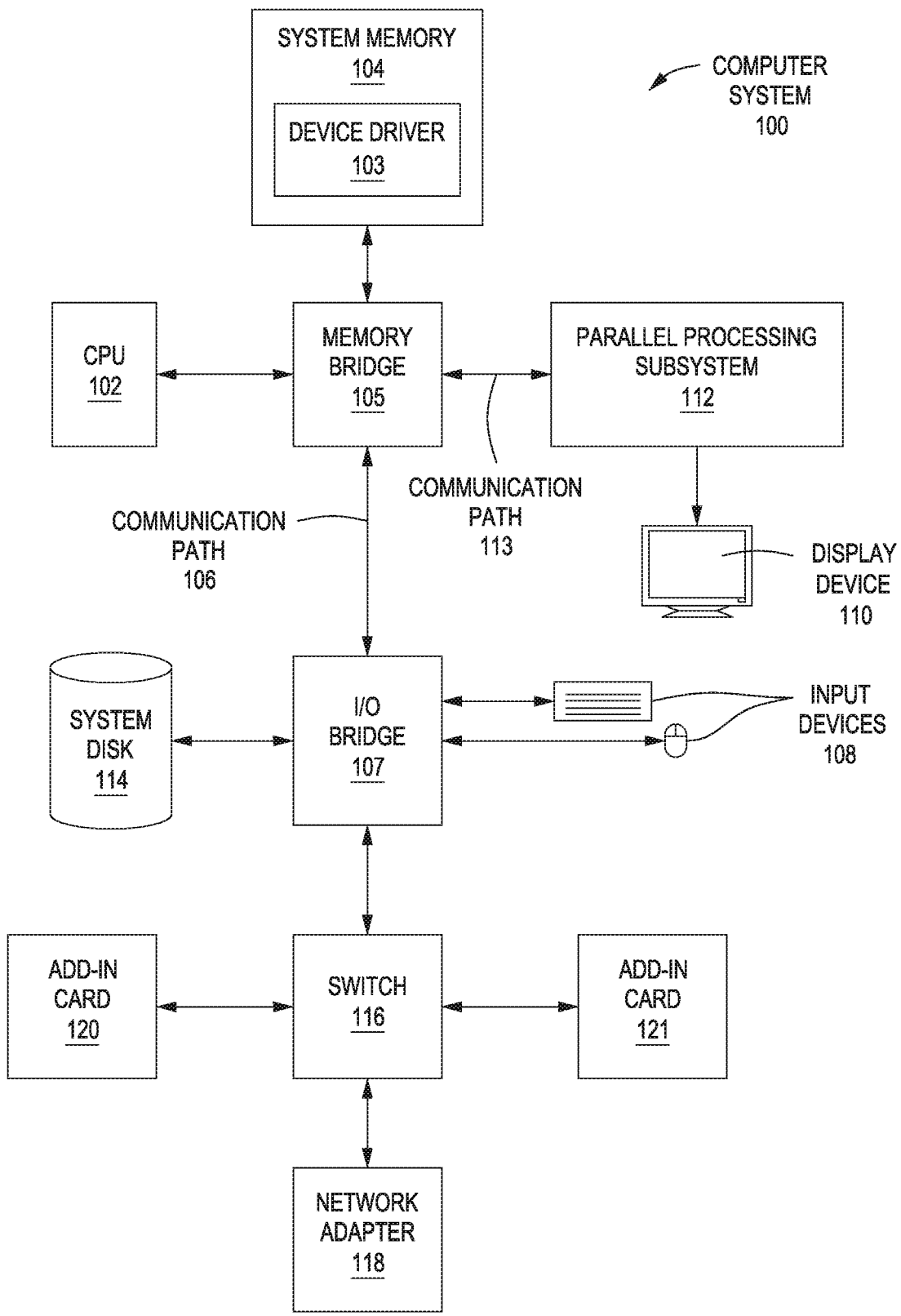
FIG. 1 is a block diagram of a computer system configured to implement one or more aspects of the present invention.

FIG. 1 is a block diagram of a computer system 100 configured to implement one or more aspects of the present invention. As shown, computer system 100 includes, without limitation, a central processing unit (CPU) 102 and a system memory 104 coupled to a parallel processing subsystem 112 via a memory bridge 105 and a communication path 113. Memory bridge 105 is further coupled to an I/O (input/output) bridge 107 via a communication path 106, and I/O bridge 107 is, in turn, coupled to a switch 116.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in FIG. 2, such circuitry may be incorporated across one or more parallel processing units (PPUs) included within parallel processing subsystem 112. In other embodiments, the parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more other the other elements of FIG. 1 to form a single system. For example, parallel processing subsystem 112 may be integrated with CPU 102 and other connection circuitry on a single chip to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Figure 2:
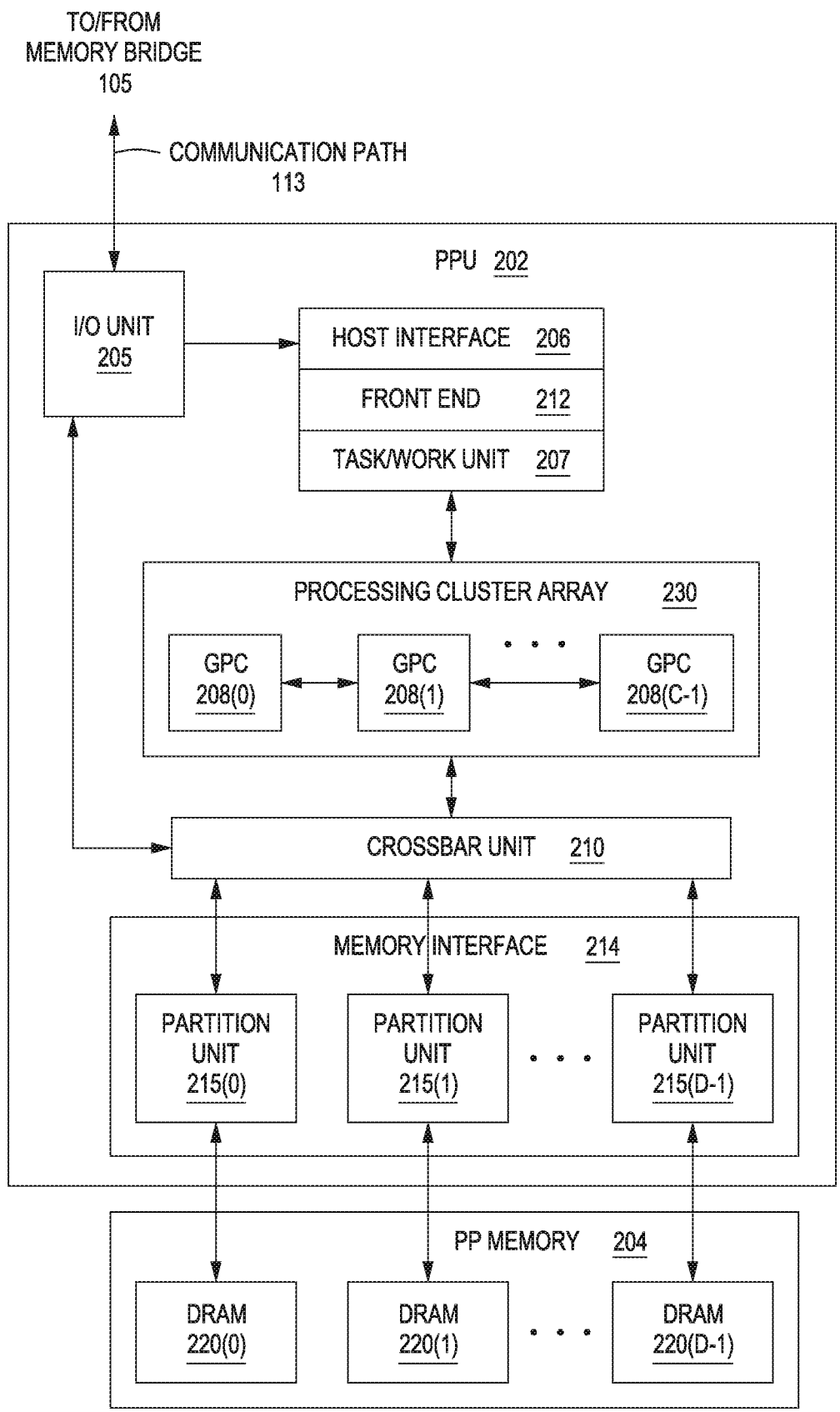
FIG. 2 is a block diagram of a parallel processing unit included in the parallel processing subsystem of FIG. 1, according to various embodiments of the present invention.

FIG. 2 is a block diagram of a parallel processing unit (PPU) 202 included in the parallel processing subsystem 112 of FIG. 1, according to various embodiments of the present invention. Although FIG. 2 depicts one PPU 202, as indicated above, parallel processing subsystem 112 may include any number of PPUs 202. As shown, PPU 202 is coupled to a local parallel processing (PP) memory 204. PPU 202 and PP memory 204 may be implemented using one or more integrated circuit devices, such as programmable processors, application specific integrated circuits (ASICs), or memory devices, or in any other technically feasible fashion.

In some embodiments, PPU 202 comprises a graphics processing unit (GPU) that may be configured to implement a graphics rendering pipeline to perform various operations related to generating pixel data based on graphics data supplied by CPU 102 and/or system memory 104. When processing graphics data, PP memory 204 can be used as graphics memory that stores one or more conventional frame buffers and, if needed, one or more other render targets as well. Among other things, PP memory 204 may be used to store and update pixel data and deliver final pixel data or display frames to display device 110 for display. In some embodiments, PPU 202 also may be configured for general-purpose processing and compute operations.

In operation, CPU 102 is the master processor of computer system 100, controlling and coordinating operations of other system components. In particular, CPU 102 issues commands that control the operation of PPU 202. In some embodiments, CPU 102 writes a stream of commands for PPU 202 to a data structure (not explicitly shown in either FIG. 1 or FIG. 2) that may be located in system memory 104, PP memory 204, or another storage location accessible to both CPU 102 and PPU 202. A pointer to the data structure is written to a pushbuffer to initiate processing of the stream of commands in the data structure. The PPU 202 reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

As also shown, PPU 202 includes an I/O (input/output) unit 205 that communicates with the rest of computer system 100 via the communication path 113 and memory bridge 105. I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to PP memory 204) may be directed to a crossbar unit 210. Host interface 206 reads each pushbuffer and transmits the command stream stored in the pushbuffer to a front end 212.

As mentioned above in conjunction with FIG. 1, the connection of PPU 202 to the rest of computer system 100 may be varied. In some embodiments, parallel processing subsystem 112, which includes at least one PPU 202, is implemented as an add-in card that can be inserted into an expansion slot of computer system 100. In other embodiments, PPU 202 can be integrated on a single chip with a bus bridge, such as memory bridge 105 or I/O bridge 107. Again, in still other embodiments, some or all of the elements of PPU 202 may be included along with CPU 102 in a single integrated circuit or system of chip (SoC).

In operation, front end 212 transmits processing tasks received from host interface 206 to a work distribution unit (not shown) within task/work unit 207. The work distribution unit receives pointers to processing tasks that are encoded as task metadata (TMD) and stored in memory. The pointers to TMDs are included in a command stream that is stored as a pushbuffer and received by the front end unit 212 from the host interface 206. Processing tasks that may be encoded as TMDs include indices associated with the data to be processed as well as state parameters and commands that define how the data is to be processed. For example, the state parameters and commands could define the program to be executed on the data. The task/work unit 207 receives tasks from the front end 212 and ensures that GPCs 208 are configured to a valid state before the processing task specified by each one of the TMDs is initiated. A priority may be specified for each TMD that is used to schedule the execution of the processing task. Processing tasks also may be received from the processing cluster array 230. Optionally, the TMD may include a parameter that controls whether the TMD is added to the head or the tail of a list of processing tasks (or to a list of pointers to the processing tasks), thereby providing another level of control over execution priority.

PPU 202 advantageously implements a highly parallel processing architecture based on a processing cluster array 230 that includes a set of C general processing clusters (GPCs) 208, where C☐1. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary depending on the workload arising for each type of program or computation.

Memory interface 214 includes a set of D of partition units 215, where D☐1. Each partition unit 215 is coupled to one or more dynamic random access memories (DRAMs) 220 residing within PPM memory 204. In one embodiment, the number of partition units 215 equals the number of DRAMs 220, and each partition unit 215 is coupled to a different DRAM 220. In other embodiments, the number of partition units 215 may be different than the number of DRAMs 220. Persons of ordinary skill in the art will appreciate that a DRAM 220 may be replaced with any other technically suitable storage device. In operation, various render targets, such as texture maps and frame buffers, may be stored across DRAMs 220, allowing partition units 215 to write portions of each render target in parallel to efficiently use the available bandwidth of PP memory 204.

A given GPCs 208 may process data to be written to any of the DRAMs 220 within PP memory 204. Crossbar unit 210 is configured to route the output of each GPC 208 to the input of any partition unit 215 or to any other GPC 208 for further processing. GPCs 208 communicate with memory interface 214 via crossbar unit 210 to read from or write to various DRAMs 220. In one embodiment, crossbar unit 210 has a connection to I/O unit 205, in addition to a connection to PP memory 204 via memory interface 214, thereby enabling the processing cores within the different GPCs 208 to communicate with system memory 104 or other memory not local to PPU 202. In the embodiment of FIG. 2, crossbar unit 210 is directly connected with I/O unit 205. In various embodiments, crossbar unit 210 may use virtual channels to separate traffic streams between the GPCs 208 and partition units 215.

Again, GPCs 208 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shades programs), general compute operations, etc. In operation, PPU 202 is configured to transfer data from system memory 104 and/or PP memory 204 to one or more on-chip memory units, process the data, and write result data back to system memory 104 and/or PP memory 204. The result data may then be accessed by other system components, including CPU 102, another PPU 202 within parallel processing subsystem 112, or another parallel processing subsystem 112 within computer system 100.

As noted above, any number of PPUs 202 may be included in a parallel processing subsystem 112. For example, multiple PPUs 202 may be provided on a single add-in card, or multiple add-in cards may be connected to communication path 113, or one or more of PPUs 202 may be integrated into a bridge chip. PPUs 202 in a multi-PPU system may be identical to or different from one another. For example, different PPUs 202 might have different numbers of processing cores and/or different amounts of PP memory 204. In implementations where multiple PPUs 202 are present, those PPUs may be operated in parallel to process data at a higher throughput than is possible with a single PPU 202. Systems incorporating one or more PPUs 202 may be implemented in a variety of configurations and form factors, including, without limitation, desktops, laptops, handheld personal computers or other handheld devices, servers, workstations, game consoles, embedded systems, and the like.

Figure 3A:
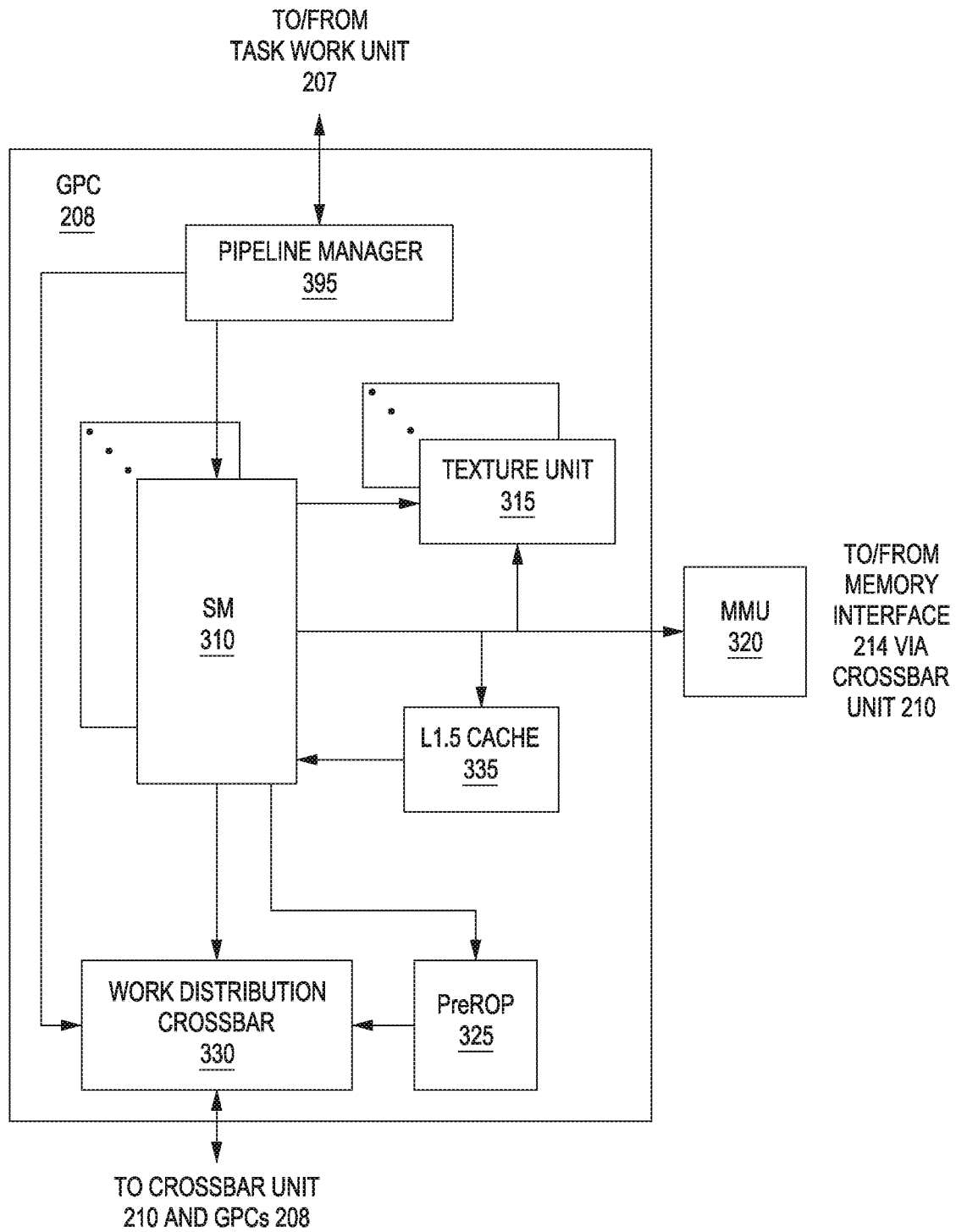
FIG. 3A is a block diagram of a general processing cluster included in the parallel processing unit of FIG. 2, according to various embodiments of the present invention.

FIG. 3A is a block diagram of a GPC 208 included in PPU 202 of FIG. 2, according to various embodiments of the present invention. In operation, GPC 208 may be configured to execute a large number of threads in parallel to perform graphics, general processing and/or compute operations. As used herein, a "thread" refers to an instance of a particular program executing on a particular set of input data. In some embodiments, single-instruction, multiple-data (SIMD) instruction issue techniques are used to support parallel execution of a large number of threads without providing multiple independent instruction units. In other embodiments, single-instruction, multiple-thread (SIMT) techniques are used to support parallel execution of a large number of generally synchronized threads, using a common instruction unit configured to issue instructions to a set of processing engines within GPC 208. Unlike a SIMD execution regime, where all processing engines typically execute identical instructions, SIMT execution allows different threads to more readily follow divergent execution paths through a given program. Persons of ordinary skill in the art will understand that a SIMD processing regime represents a functional subset of a SIMT processing regime.

Operation of GPC 208 is controlled via a pipeline manager 305 that distributes processing tasks received from a work distribution unit (not shown) within task/work unit 207 to one or more streaming multiprocessors (SMs) 310. Pipeline manager 305 may also be configured to control a work distribution crossbar 330 by specifying destinations for processed data output by SMs 310.

In one embodiment, GPC 208 includes a set of M of SMs 310, where M≥1. Also, each SM 310 includes a set of functional execution units (not shown), such as execution units and load-store units. Processing operations specific to any of the functional execution units may be pipelined, which enables a new instruction to be issued for execution before a previous instruction has completed execution. Any combination of functional execution units within a given SM 310 may be provided. In various embodiments, the functional execution units may be configured to support a variety of different operations including integer and floating point arithmetic (e.g., addition and multiplication), comparison operations, Boolean operations (AND, OR, XOR), bit-shifting, and computation of various algebraic functions (e.g., planar interpolation and trigonometric, exponential, and logarithmic functions, etc.). Advantageously, the same functional execution unit can be configured to perform different operations.

In operation, each SM 310 is configured to process one or more thread groups. As used herein, a "thread group" or "warp" refers to a group of threads concurrently executing the same program on different input data, with one thread of the group being assigned to a different execution unit within an SM 310. A thread group may include fewer threads than the number of execution units within the SM 310, in which case some of the execution may be idle during cycles when that thread group is being processed. A thread group may also include more threads than the number of execution units within the SM 310, in which case processing may occur over consecutive clock cycles. Since each SM 310 can support up to G thread groups concurrently, it follows that up to G*M thread groups can be executing in GPC 208 at any given time.

Additionally, a plurality of related thread groups may be active (in different phases of execution) at the same time within an SM 310. This collection of thread groups is referred to herein as a "cooperative thread array" ("CTA") or "thread array," The size of a particular CTA is equal to m*k, where k is the number of concurrently executing threads in a thread group, which is typically an integer multiple of the number of execution units within the SM 310, and m is the number of thread groups simultaneously active within the SM 310.

Although not shown in FIG. 3A, each SM 310 contains a level one (L1) cache or uses space in a corresponding L1 cache outside of the SM 310 to support, among other things, load and store operations performed by the execution units. Each SM 310 also has access to level two (L2) caches (not shown) that are shared among all GPCs 208 in PPU 202. The L2 caches may be used to transfer data between threads. Finally, SMs 310 also have access to off-chip "global" memory, which may include PP memory 204 and/or system memory 104. It is to be understood that any memory external to PPU 202 may be used as global memory. Additionally, as shown in FIG. 3A, a level one-point-five (L1.5) cache 335 may be included within GPC 208 and configured to receive and hold data requested from memory via memory interface 214 by SM 310. Such data may include, without limitation, instructions, uniform data, and constant data. In embodiments having multiple SMs 310 within GPC 208, the SMs 310 may beneficially share common instructions and data cached in L1.5 cache 335.

Each GPC 208 may have an associated memory management unit (MMU) 320 that is configured to map virtual addresses into physical addresses. In various embodiments, MMU 320 may reside either within GPC 208 or within the memory interface 214. The MMU 320 includes a set of page table entries (PTEs) used to map a virtual address to a physical address of a tile or memory page and optionally a cache line index. The MMU 320 may include address translation lookaside buffers (TLB) or caches that may reside within SMs 310, within one or more L1 caches, or within GPC 208.

In graphics and compute applications, GPC 208 may be configured such that each SM 310 is coupled to a texture unit 315 for performing texture mapping operations, such as determining texture sample positions, reading texture data, and filtering texture data.

In operation, each SM 310 transmits a processed task to work distribution crossbar 330 in order to provide the processed task to another GPC 208 for further processing or to store the processed task in an L2 cache (not shown), parallel processing memory 204, or system memory 104 via crossbar unit 210. In addition, a pre-raster operations (preROP) unit 325 is configured to receive data from SM 310, direct data to one or more raster operations (ROP) units within partition units 215, perform optimizations for color blending, organize pixel color data, and perform address translations.

It will be appreciated that the core architecture described herein is illustrative and that variations and modifications are possible. Among other things, any number of processing units, such as SMs 310, texture units 315, or preROP units 325, may be included within GPC 208. Further, as described above in conjunction with FIG. 2, PPU 202 may include any number of GPCs 208 that are configured to be functionally similar to one another so that execution behavior does not depend on which GPC 208 receives a particular processing task. Further, each GPC 208 operates independently of the other GPCs 208 in PPU 202 to execute tasks for one or more application programs. In view of the foregoing, persons of ordinary skill in the art will appreciate that the architecture described in FIGS. 1-3A in no way limits the scope of the present invention.

Figure 3B:
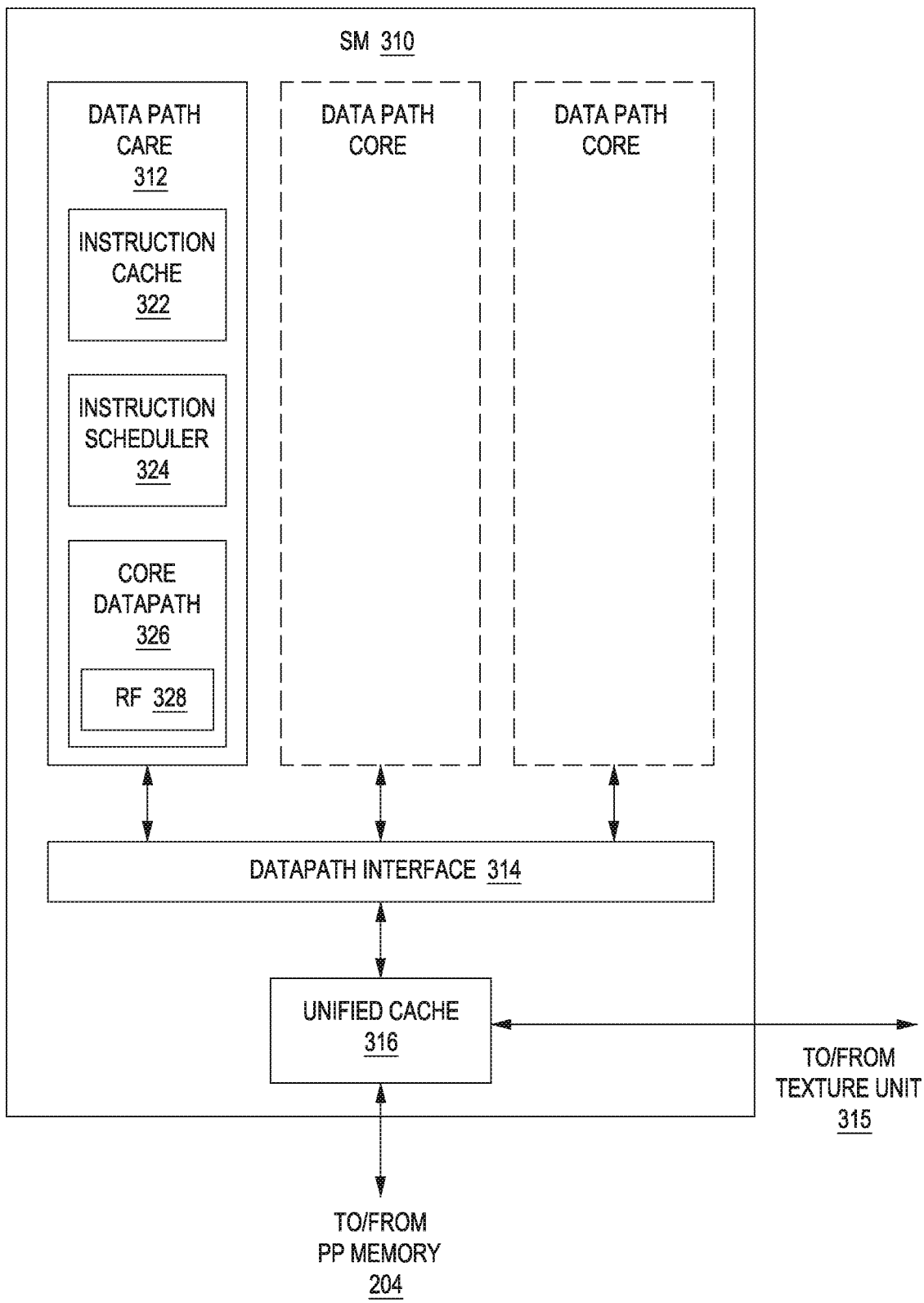
FIG. 3B is a block diagram of the streaming multiprocessor of FIG. 3A, according to various embodiments of the present invention.

FIG. 3B is a more detailed illustration of the streaming multiprocessor (SM) of FIG. 3A, according to various embodiments of the present invention. As shown, SM 310 includes one or more datapath cores 312 coupled to a datapath interface 314 that, in turn, is coupled to a unified cache 316.

Each data path core 312 is configured to execute instructions associated with threads included in a thread group or warp. A given datapath core 312 includes an instruction cache 322, an instruction scheduler 324, and a core datapath 326 that includes a register file 328. Instruction cache 322 caches instructions to be executed for threads in one or more thread groups. Instruction scheduler 324 schedules cached instructions for execution. Core datapath 326 includes various units configured to execute instructions, including execution units, load/store units, and so forth. Register file 328 is configured to store data processed within core datapath 326.

Unified cache 316 is a subsystem configured to store data on behalf of a number of different clients, including thread groups, texture unit 315, and potentially others. Unified cache 316 combines the functionalities associated with an L1 cache, a shared (scratchpad) memory, a texture cache, and other types of cache memories to provide high bandwidth low-latency storage with streaming capabilities. Unified cache 316 includes a number of different data pathways to handle different types of memory transactions, all of which are ultimately serviced by a unified data memory, as described in greater detail below in conjunction with FIG. 4.

Unified Cache Architecture

Figure 4:
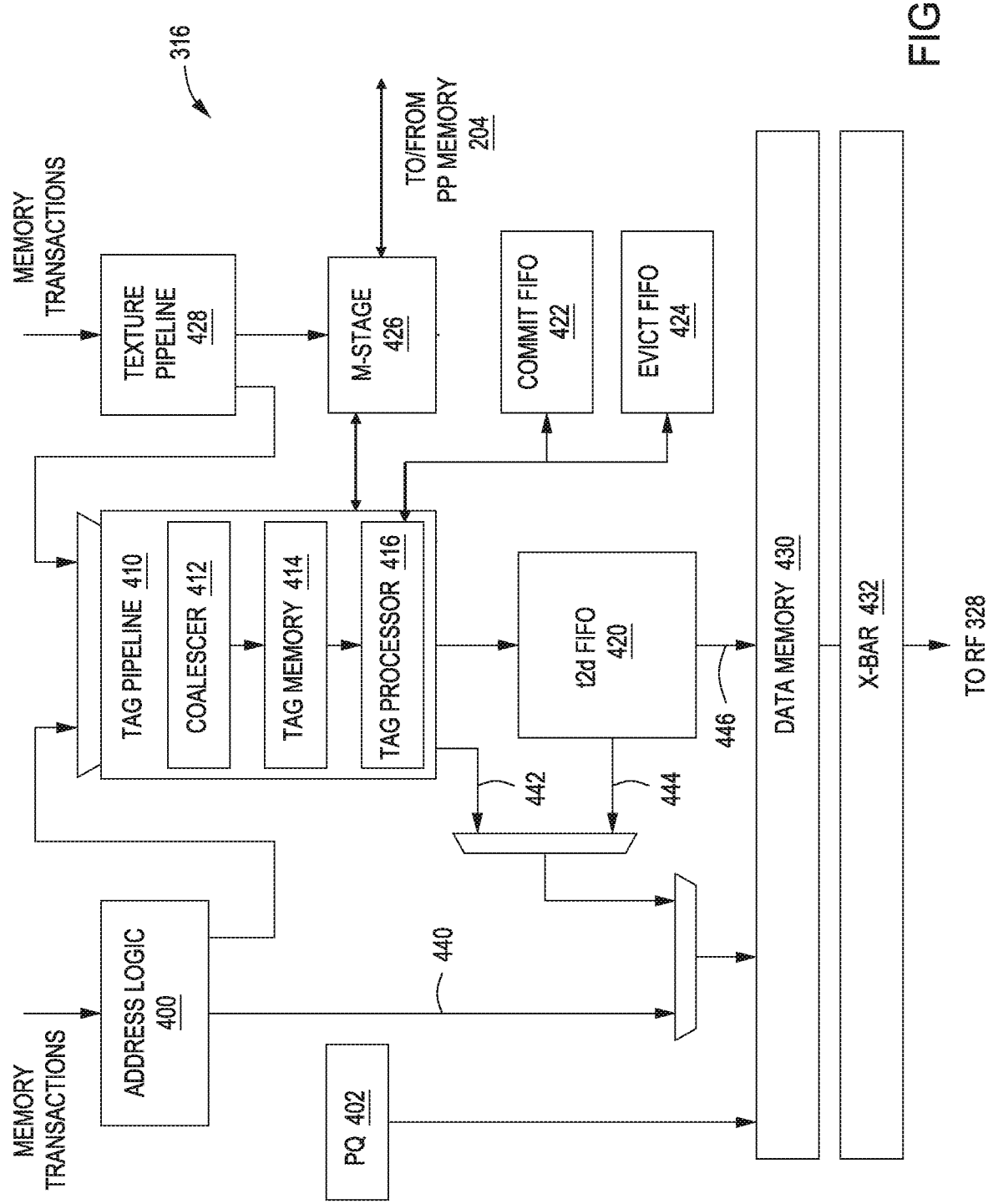
FIG. 4 is a block diagram of the unified cache of FIG. 3B, according to various embodiments of the present invention.

FIG. 4 is a more detailed illustration of the unified cache of FIG. 3B, according to various embodiments of the present invention. As shown, unified cache 316 includes address logic 400, a parameter queue (PQ) 402, a tag pipeline 410, a tag-to-data (t2d) first-in first-out (FIFO) 420, a commit FIFO 422, an evict FIFO 424, a miss stage (m-stage) 426, a data memory 430, and a crossbar (x-bar) 432. Tag pipeline 410 includes a coalescer 412, a tag memory 414, and a tag processor 416. Tag pipeline 410 is coupled to a texture pipeline 428 that may reside within texture unit 315 of FIG. 3A.

Address logic 400 is configured to receive memory transactions and generate addresses for servicing those transactions. Address logic 400 may include an address generation unit (AGU) and an address collector (none shown). Address logic 400 also determines a type associated with each received memory transaction and then routes memory transactions based on type. Address logic 400 routes shared memory transactions along data pathway 440 directly to data memory 430. Accordingly, unified cache 316 is capable of servicing shared (scratchpad) memory transactions with relatively low latency. Address logic 400 routes local/global memory transactions to tag pipeline 410.

Tag pipeline 410 services memory transactions received from address logic 400 and also those received from texture pipeline 428. In one embodiment, unified cache 316 includes multiple tag banks. To process a set of memory transactions received from address logic 400 (i.e., non texture-oriented memory transactions), coalescer 412 within tag pipeline 420 first determines which tag bank any two or more memory transactions target, and then coalesces those which target the same bank. Coalescer 412 passes coalesced and non-coalesced memory transactions to tag memory 414. For a given non-texture memory transaction, tag processor 416 determines whether a tag is resident in tag memory 414 for that transaction. If tag processor 416 locates a tag and the corresponding data is marked present, a cache hit occurs and tag processor 416 routes the memory transaction along data pathway 442 to data memory 430. In one embodiment data pathway 442 includes additional address logic, such as an address collector, for example. Tag processor 416 includes a data pointer in the memory transaction that is derived from the located tag and that references a specific data slot in data memory 430. If tag processor 416 does not locate a tag, a cache miss occurs and tag processor 416 allocates a tag and requests miss data from external memory, such as local memory or global memory. Tag processor 416 interacts with m-stage 426 to process miss data. Tag processor 416 then pushes the memory transaction onto t2d FIFO 420 and the transaction is stalled until the miss data is returned to data memory 430 and the associated memory transaction reaches the top of t2d FIFO 420. Tag Processor 416 also pushes the transaction into t2d FIFO 420 if the tag is located but the data is not present. This latter case is referred to as a "hit on miss" and is described in greater detail below in conjunction with FIG. 9. Upon reaching the top of t2d FIFO 420, t2d FIFO 420 transmits the memory transaction along data pathway 444 to data memory 430.

Tag pipeline 410 also services texture-oriented memory transactions received along data pathway 448. In doing so, coalescer 412 determines whether any received transactions can be coalesced, in like fashion as described above. Tag processor 416 then searches tag memory 414 for tags corresponding to the received memory transactions. If tag processor 416 locates a tag for a given texture-oriented transaction, a cache hit occurs and tag processor 416 pushes the transaction onto t2d FIFO 420. When the memory transaction reaches the top of t2d FIFO 420, t2d FIFO 420 transmits the transaction along data pathway 446 to data memory 430 for servicing. Alternatively, if tag processor 416 does not locate a tag, a cache miss occurs and tag processor 416 allocates a tag and requests miss data for the transaction. In doing so tag processor 416 interacts with M-stage 416, as mentioned. Tag processor 416 pushes the memory transaction onto t2d FIFO 420. When the transaction reaches the top of t2d FIFO 420 and the miss data is returned to data memory 430 by m-stage 416, t2d FIFO 420 transmits the memory transaction along data pathway 446 to data memory 430.

In one embodiment, tag pipeline 410 maintains a mask for each tag that indicates which offsets for a given address have been modified. The mask may have any granularity, although in practice the mask has word-level granularity meaning that the mask indicates whether a particular word of data has been modified. If a word is fully covered by a store-type memory transaction, then the corresponding mask is set to one. If tag pipeline 410 receives a load-type memory transaction for that word, tag pipeline 410 determines that a cache hit occurs because the mask is fully covered. In another embodiment, tag pipeline 410 may determine that multiple threads access sub-word portions of a word that is fully covered by the corresponding mask. In such situations, coalescer 412 may coalesce the associated memory transactions.

In one embodiment, m-stage 426 may also implement certain features to allow data memory 430 to operate as a write-through cache. In particular, when unified cache 316 handles a store-type memory transaction, PQ 402 supplies store data to data memory 430. M-stage 426 then reads the data from data memory 430 and writes the data to an L2 cache (not shown) residing outside SM 310. Upon writing to L2 cache, m-stage 426 may obtain sparsity bits indicating whether the data stored is considered sparse. In another embodiment, m-stage 426 coalesces store-type memory transactions after processing via tag pipeline 410. In doing so, m-stage 426 may receive multiple store-type memory transactions and combine these operations. M-stage 426 may coalesce load-type memory transactions as well, by merging multiple requests for adjacent data. Unified cache 316 controls the coalescing functionality described by maintaining a global counter. When the global counter expires, all coalescing sequences are broken and the associated memory transactions are flushed to a subsequent level in the memory hierarchy. In one embodiment, load transactions will only coalesce up to the point where all sectors of a line have been requested before those sectors are sent to L2.

Summarizing the above, unified cache 316 processes different types of memory transactions along different data pathways. Unified cache 316 processes shared memory transactions along data pathway 440 with low latency. Unified cache 316 processes non-shared memory transactions via tag pipeline 410. Tag pipeline 410 directs non-shared memory transactions along low latency data pathway 442 when a cache hit occurs, and routes memory transactions through t2d FIFO 420 and data pathway 444 when a cache miss occurs. Unified cache 316 also processes texture-oriented memory transactions received from texture pipeline 428. In the case of either a cache hit or a cache miss, tag pipeline 410 directs texture-oriented memory transactions through t2d FIFO 420 and data pathway 446.

In one embodiment, data pathways 440, 442, and 444 couple to a first crossbar that provides access to a first set of sub-banks within data memory 430 and data pathway 446 couples to a second crossbar that provides access to a second set of sub-banks within data memory 430. The second set of sub-banks can be accessed in parallel with the first set of sub-banks, allowing unified cache 316 to feed different types of memory transactions to data memory 430 in parallel with one another, thereby providing reduced latency and increased bandwidth. The two x-bars could be included in, for example, x-bar 432 shown in FIG. 4. In a further embodiment, the first crossbar described above could be connected across a global memory cache region of data memory 430 and a shared memory scratchpad region of data memory 430, while the second crossbar could be connected across a texture cache region of data memory 430.

Unified cache 316 implements several techniques to coordinate the servicing of memory transactions and to manage data that is stored in data memory 220. These techniques are described in greater detail below in conjunction with FIGS. 5-8D.

Figure 5:
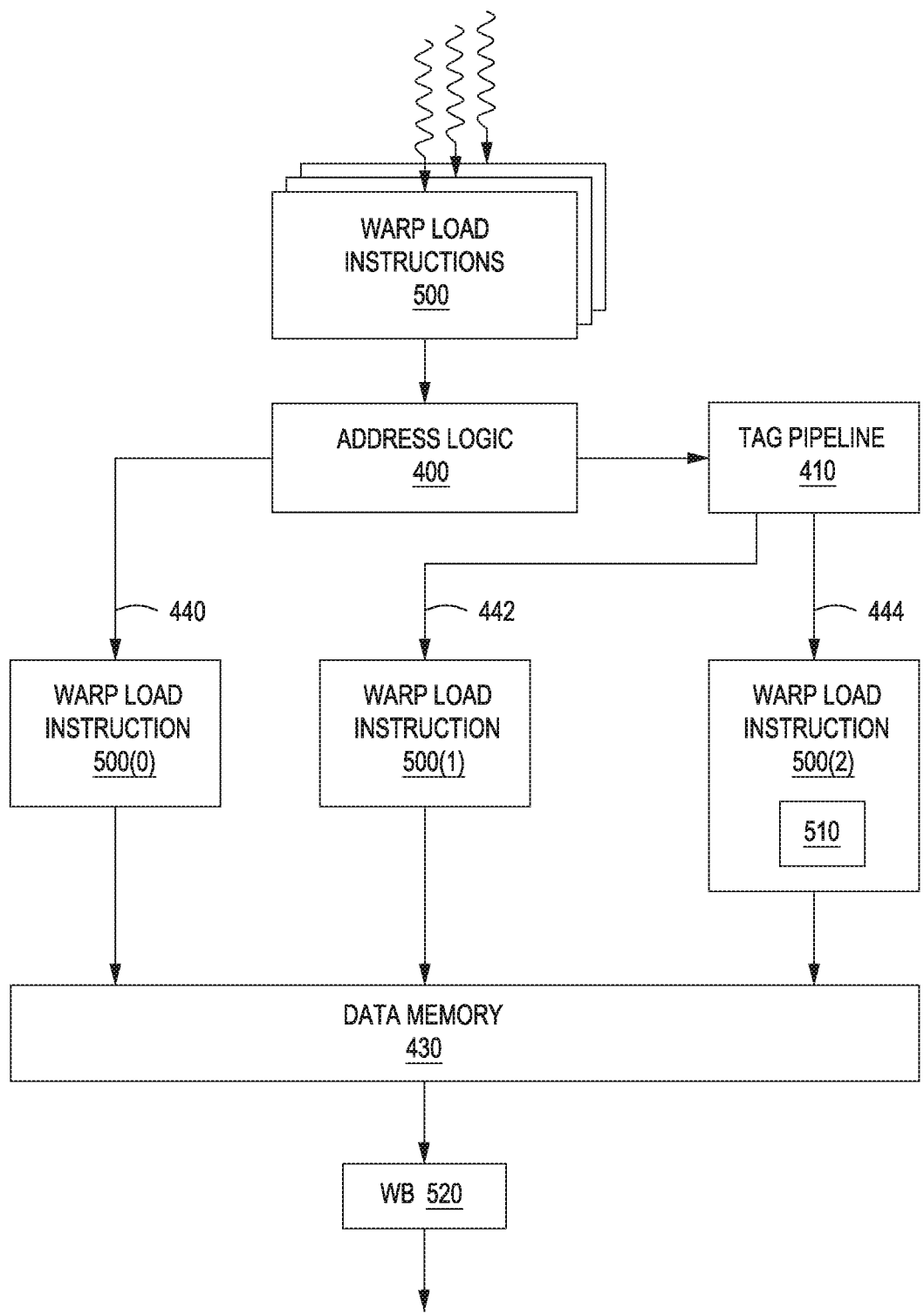
FIG. 5 is a conceptual diagram of a set of memory transactions processed via different data pathways within the unified cache of FIG. 4, according to various embodiments of the present invention.

FIG. 5 is a conceptual diagram of a set of memory transactions processed via different data pathways within the unified cache of FIG. 4, according to various embodiments of the present invention. In some situations unified cache 316 services memory transactions at different times due to latency discrepancies between different data pathways. Unified cache 316 implements a technique to signal SM 310 when all related memory transactions for one warp load instruction are complete, so that SM 310 can then issue dependent warp instructions.

As shown, address logic 400 is coupled to data memory 430 via data pathway 440 and tag pipeline 410 is coupled to data memory 430 via data pathways 442 and 444, as also shown in FIG. 4. Data memory 430 is coupled to a writeback buffer (WB) 520. WB 520 may reside downstream of x-bar 432 shown in FIG. 4. Address logic 400 receives a set 500 of warp load instructions that are associated with one or more threads attempting to load data. Address logic 400 transmits warp load instructions 500(0) targeting shared memory along data pathway 440, and transmits warp load instructions 500(1) and 500(2) that target global memory to tag pipeline 410. In the example shown, memory transaction 500(1) may be a global memory transaction for which a cache hit occurred, and memory transaction 500(2) may be a global memory transaction for which a cache miss occurred. In one embodiment, address logic 400 receives one memory transaction that targets data stored across addresses from different address spaces, and then generates multiple child memory transactions in response.

Because data pathways 440, 442, and 444 service memory transactions with varying latency, load data that is returned for memory transactions 500 may be available at different times. Unified cache 316 implements a mechanism for signaling to WB 520 that all data is returned. In particular, unified cache 316 adds a token 510 to the memory request that traverses the highest latency data pathway. In the example shown, the highest latency pathway is data pathway 444. When WB 520 receives memory transaction 500(2) that includes token 510, WB 520 determines that all load data is returned, and may then send a completion signal to SM 310. The completion signal indicates a scoreboard number sent with the original load instruction. WB 510 may accumulate load data associated with one data pathway and then release that data to SM 310 when all data has been returned. Alternatively, WB 310 may receive data incrementally and transmit data back to SM 310.

In one embodiment, tag processor 416 adds token 510 to memory transactions for which a cache miss occurs. In another embodiment, token 510 includes an identifier for a scoreboard that is used to track return data. When WB 520 receives token 510, WB 520 may indicate that the associated scoreboard should be decremented, indicating that the return data is complete. In a further embodiment, SM 310 increments the scoreboard when issuing the load instruction, and decrements the scoreboard when it receives the completion signal. In some cases multiple different load instructions may use the same scoreboard number. In such cases, SM 310 waits until the scoreboard decrements to zero to ensure that all data for the associated load instructions has returned before issuing any dependent instructions.

FIGS. 6A-6D are conceptual diagrams of a set of memory transactions that target the same data within the unified cache of FIG. 4, according to various embodiments of the present invention. Unified cache 316 implements a technique described herein to preserve data stored in data memory 430 until related outstanding memory transactions are complete.

As shown in FIG. 6A, a data slot 600 includes a data present bit 602 and a reference (ref) counter 604. A memory transaction 610 is in flight for data stored in data slot 600. In the example shown, a cache miss occurs for data requested via memory transaction 610, and tag pipeline 410 allocates a tag in tag memory 414 and a data slot 600 for the return miss data. Data present bit 602 is initially set to 0 because the miss data is not yet returned. Ref counter 604 has initial value of 2 in order to indicate that two other entities reference data slot 600: a tag stored in tag memory 414, and memory transaction 610. In one embodiment data memory 430 tracks data present status at a plurality of subdivisions of a cache line (commonly referred to as sectors). In this embodiment, on a cache miss tag pipeline 410 marks each sector that includes a requested address as valid (not shown in FIGS. 6A-6D) when allocating a tag. This procedure indicates that a miss request is already in flight for that sector and subsequently tracks when data for each sector is present. Further, when processing a load-type memory transaction where a tag is found for a cache line but one or more sectors within that cache line including the set of requested addresses are not valid, tag pipeline 410 reuses the same tag location but only requests miss data for the subset of sectors not already valid and increments ref counter 604. The details for supporting sectors are not shown in FIG. 6A-6D or 9-13. However, persons skilled in the art will generally understand that data present bit 602 could be replaced by a plurality of data present bits while maintaining only one ref counter 604 per cache line.

In FIG. 6B, unified cache 316 receives another memory transaction 612 that targets data slot 600. A tag hit to an in-flight memory transaction occurs because a tag was allocated for the miss data, as described above. In response to receiving memory transaction 612, tag pipeline 410 increments ref counter 604 to 3, indicating that now three entities reference data slot 600: the tag in tag memory 414, memory transaction 610, and memory transaction 612. Tag pipeline 410 pushes memory transaction 612 onto t2d FIFO 420, despite the occurrence of the cache hit, because the data is not yet available. When the miss data is returned via m-stage 426, tag pipeline 410 sets data present bit 602 to 1.

In one embodiment, if ref counter 604 saturates to a maximum value data memory 430 then creates a copy of data slot 600 to handle future memory transactions. In another embodiment, if ref counter 604 saturates to a maximum value then ref counter 604 locks to the maximum value and does not increment or decrement. When the tag in tag memory 414 associated with data slot 600 is subsequently evicted, a token with a pointer to data slot 600 is pushed onto evict FIFO 424 and scheduled for eviction. Upon being dequeued, the evict FIFO 424 detects that the data slot 600 is saturated and then enqueues a token with a pointer to the data slot to t2d FIFO 420. Upon the token reaching the head of t2d FIFO 420, ref counter 604 in data slot 600 is reset to 0.

In FIG. 6C, memory transaction 610 is completed. In response, tag pipeline 410 decrements ref counter 604 to indicate that one less entity references the data stored in data slot 600. In FIG. 6D, memory transaction 612 is completed and, in response, tag pipeline 410 decrements ref counter 604 again to indicate that one less entity references the data stored in data slot 600. In the state shown in FIG. 6D, only the tag in tag memory 414 references data slot 600. Under various circumstances the tag may be evicted from tag memory 414, at which point a token with a pointer to data slot 600 is pushed onto evict FIFO 424. Upon the token being dequeued, the evict FIFO 424 decrements ref counter 604 to 0. Data slot 600 is then free and may be overwritten with other data. In various embodiments, t2d FIFO 420, evict FIFO 424, m-stage 426, and/or tag pipeline 410 are configured to increment or decrement ref counter 604 in response to additionally received memory transactions or completed memory transactions.

Referring generally to FIGS. 6A-6D, unified cache 316 implements the technique described above in order to prevent premature purging of data from data memory 430. This technique allows unified cache 316 to support multiple hits on in-flight miss data, thereby increasing throughput. In addition, this technique allows the tag corresponding to a data slot to be evicted before all outstanding memory transactions that target that data slot are complete. In one embodiment, data memory 430 maintains a data present bit per N-byte sector within each M-byte cache line, where N and M are integers and M is greater than N.

Figure 7:
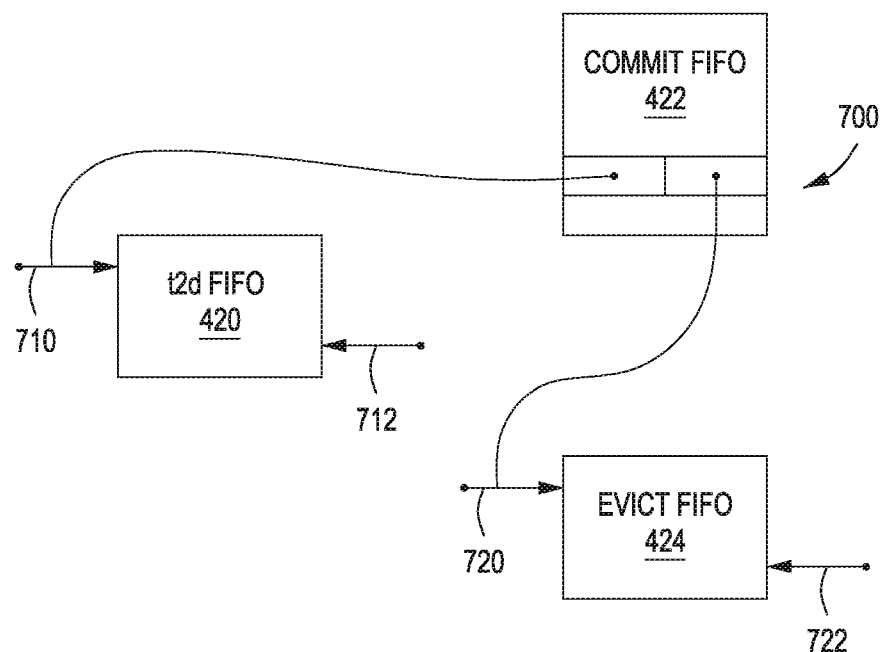
FIG. 7 is a conceptual diagram illustrating the relationship among the different FIFOs within the unified cache of FIG. 4, according to various embodiments of the present invention.

FIG. 7 is a conceptual diagram illustrating the relationship among the different FIFOs within the unified cache of FIG. 4, according to various embodiments of the present invention. Unified cache 316 implements commit FIFO 422 to track load hit transactions that traverse data pathway 442 and to prevent data targeted by those transactions from being prematurely evicted from data memory 430. Data slots scheduled for eviction are stored within evict FIFO 424.

As shown, commit FIFO 422 includes an entry 700 that references enqueue pointer 710 of t2d FIFO 420 and enqueue pointer 720 of evict FIFO 424. Commit FIFO 422 may include many such entries. Tag processor 416 pushes an entry onto commit FIFO 422 upon receiving a load hit transaction. When a load hit transaction is complete, commit FIFO 422 pops the corresponding entry. Accordingly, commit FIFO 422 provides a record of load hit transactions that are not yet complete. Evict FIFO 424 is interlocked with commit FIFO 422 and cannot evict data associated with incomplete memory transactions.

More specifically, evict FIFO 424 dequeues eviction entries in order to retire data slots. However, when dequeuing an entry, evict FIFO 424 first checks the top of commit FIFO 422 and determines whether enqueue pointer 720, previously recorded from evict FIFO 424, matches the index of the entry to be dequeued. If the entries match, then evict FIFO 424 would be evicting data for which an outstanding memory transaction exists. In response, evict FIFO 424 halts dequeuing the entry. With this approach, eviction FIFO 424 is synchronized to commit FIFO 422 and prevented from evicting data slots too quickly.

Commit FIFO 422 implements a similar technique relative to t2d FIFO 420 in order to prevent t2d FIFO 420 from dequeuing entries too quickly. This technique is specifically used when processing memory transactions related to surfaces to prevent t2d FIFO 420 completing memory transactions along data pathway 446 before other related requests are completed along data pathways 440, 442, and 444.

Figure 8A:
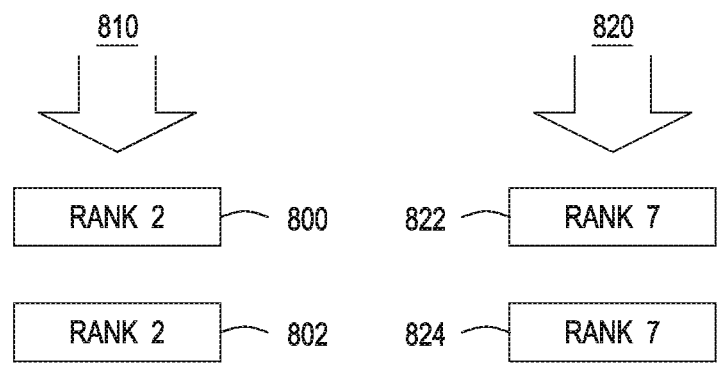
FIGS. 8A-8B are conceptual diagrams showing how the data memory within the unified cache of FIG. 4 evicts a cache line, according to various embodiments of the present invention.
Figure 8B:
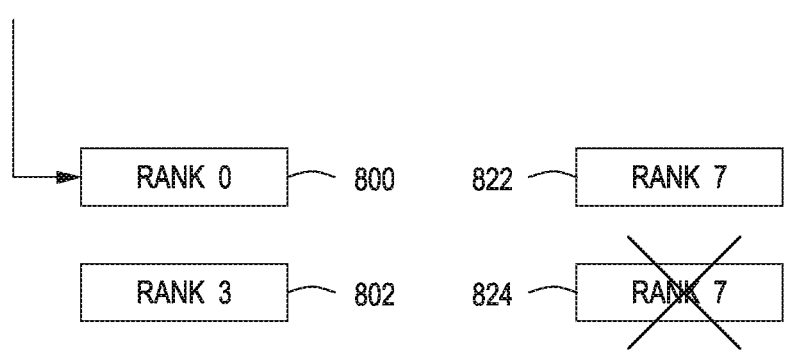

FIGS. 8A-8B are conceptual diagrams showing how the data memory within the unified cache of FIG. 4 evicts a cache line, according to various embodiments of the present invention. Data memory 430 implements a rank-based prioritization of cache lines to maintain a high cache hit rate for certain types of memory traffic and streaming throughput for other types of memory traffic.

As shown in FIG. 8A, data memory 430 allocates cache lines 800 and 802 in the same cache set in response to memory traffic 810. Memory traffic 810 may include local/global memory transactions. Data memory 430 initially assigns each of cache lines 800 and 802 a rank of 2 that corresponds to memory traffic 810. As also shown, data memory 430 generates cache lines 822 and 824 also in the same cache set in response to memory traffic 820. Memory traffic 820 may include texture-oriented memory transactions. Data memory 430 initially assigns each of cache lines 822 and 824 a rank of 7 that corresponds to memory traffic 820.

The rank of a given cache line indicates the priority with which that line should be evicted. A rank of 0 indicates that the cache line has a very low priority for eviction, while a rank of 7 indicates that the cache line has a high priority for eviction. Data memory 430 assigns a rank of 2 to cache lines created for memory traffic 810 because low latency is desirable for local/global memory transactions, and maintaining cached entries that can be retrieved quickly maintains low latency. Tag processor assigns a rank of 7 to cache lines created for memory traffic 820 because streaming throughput is desirable for texture-oriented memory transactions and quickly evicting unneeded cache lines maintains streaming throughput.

As shown in FIG. 8B, data memory 430 updates rank values based on cache line hits. In particular, data memory 430 sets the rank of cache line 800 to 0 in response to that cache line being accessed one or more times. Data memory 430 increments the rank of cache line 802 in response to that cache line not being accessed. Data memory 430 may also select a cache line for eviction based on rank. For example, because cache line 824 is one of the lines with the highest rank, data memory 430 evicts that cache line.

Referring generally to FIGS. 8A-8B, the rank-based eviction approach discussed allows unified cache 316 to operate with different characteristics for different types of traffic. In addition, unified cache 316 can also be configured to assign different ranks to cache lines on a per-instruction basis. For example, an application programmer could directly specify the rank that should be assigned to cache lines associated with a given type of memory traffic.

Referring generally to FIGS. 4-8B, the techniques described thus far allow unified cache 316 to operate with low latency and high bandwidth for memory transactions where such characteristics are important, and also operate with streaming throughput for other types of memory transactions. Additionally, because unified cache 316 combines the functionalities of several previously separate subsystems, unified cache 316 conserves valuable processor area. The various techniques discussed above are also described below in conjunction with FIGS. 9-13.

Figure 9:
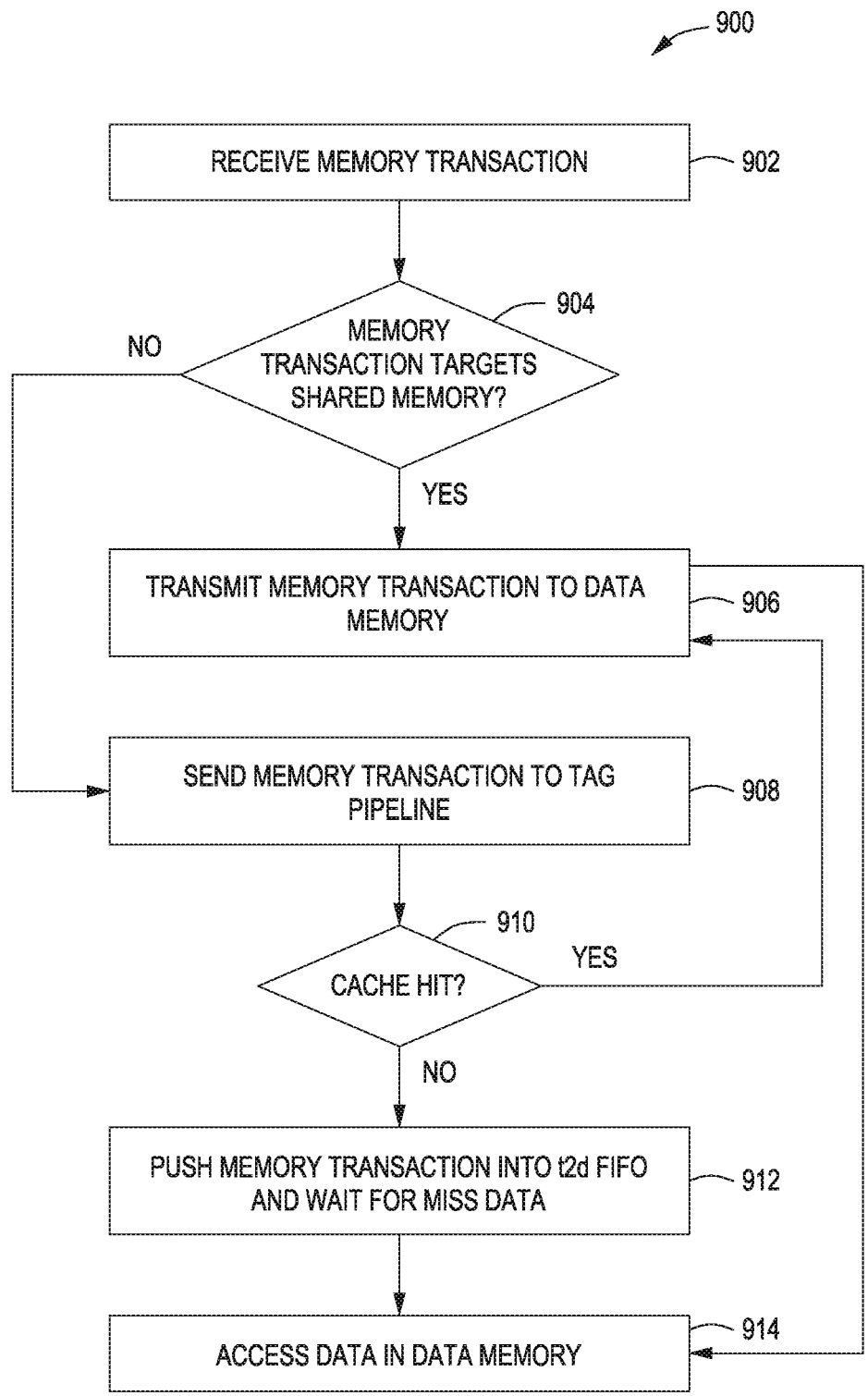
FIG. 9 is a flow diagram of method steps for servicing memory transactions via different data pathways within a unified cache, according to various embodiments of the present invention.

FIG. 9 is a flow diagram of method steps for servicing memory transactions via different data pathways within a unified cache, according to various embodiment of the present invention. Although the method steps are described in conjunction with the system of FIGS. 1-8, persons skilled in the art will understand that any system configured to perform the method steps, in any order, falls within the scope of the present invention.

As shown, a method 900 begins at step 902, where address logic 400 receives a memory transaction. Address logic 400 includes hardware configured to perform an address generation and collection procedure. At step 904, address logic 400 determines, based on the generated addresses, whether the memory transaction targets shared memory. If the memory transaction targets shared (scratchpad) memory, at step 906 address logic 400 directs the memory transaction along data pathway 440. Then, at step 914, data memory 430 accesses the targeted data based on the memory transaction.

Returning to step 904, if address logic 400 determines that the memory transaction does not target shared memory, then the method 900 proceeds to step 908 where address logic 400 transmits the memory transaction to tag pipeline 410. Coalescer 412 within tag pipeline 410 may coalesce the received memory transaction as needed. Tag processor 416 then attempts to locate a tag in tag memory 414 that references data targeted by the memory transaction.

If tag processor 414 locates a tag, a cache hit occurs or a "hit on miss" as described below, in conjunction with FIG. 11. If a meaning that the tag is present and the associated data is also present, a cache hit occurs, and the method proceeds to step 906, where the memory transaction traverses data pathway 442 to data memory 430. Otherwise, if either tag processor 414 does not locate a tag or a "hit on miss" occurs (tag present but data not present), then the method proceeds to step 912, where tag processor 416 pushes the memory transaction into t2d FIFO 420 to wait for miss data to return. When the miss data returns, m-stage 426 sets the corresponding data present bit to 1. t2d FIFO 420 pops the memory transaction and, at step 914, data memory 430 accesses the targeted data.

Persons skilled in the art will recognize that the above method steps may be applied to process texture oriented memory transactions as well. For example, at step 908 texture processing pipeline 428 may transmit a texture-oriented memory transaction to tag pipeline 410. The method 900 then performs the remaining steps in the manner described above to service the texture-oriented memory transaction. In one embodiment, for texture memory transactions the method 900 always proceeds from step 908 to step 912.

Figure 10:
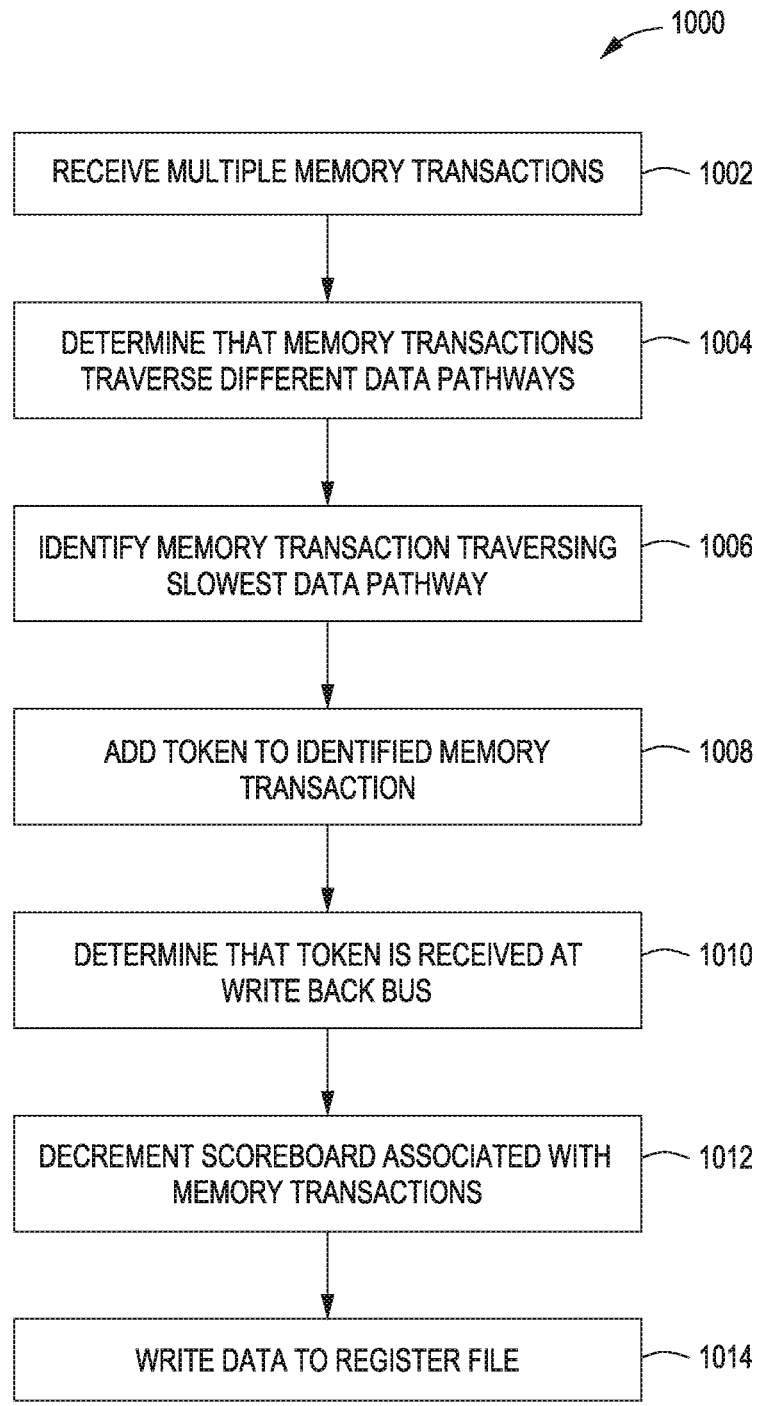
FIG. 10 is a flow diagram of method steps for collecting data returned via different data pathways within a unified cache, according to various embodiments of the present invention.

FIG. 10 is a flow diagram of method steps for collecting data returned via different data pathways within a unified cache, according to various embodiment of the present invention. Although the method steps are described in conjunction with the system of FIGS. 1-8, persons skilled in the art will understand that any system configured to perform the method steps, in any order, falls within the scope of the present invention.

As shown, a method 1000 begins at step 1002, where address logic 400 receives multiple memory transactions that target different memory regions, in one embodiment, address logic 400 receives just one memory transaction, such as a load request, that targets different portions of data residing in different memory regions. At step 1004, address logic 400 determines that the multiple memory transactions should be serviced via different data pathways, such as data pathways 440, 442, and 444, for example. In doing so, address logic may transmit memory transactions for shared memory along data pathway 400, and transmit other memory transactions to tag pipeline 410 for further routing along data pathways 442 and 444.

At step 1006, tag processor 416 within tag pipeline 410 identifies a memory transaction that is traversing the slowest data pathway compared to the other memory transactions. Tag processor 416 then adds a token to the identified memory transaction. The token corresponds to a scoreboard that manages data returned for the multiple memory transactions.

At step 1010, WB 520 receives a memory transaction that includes the token. Receipt of the token at WB 520 indicates that all other, faster memory transactions are complete. At step 1012, WB 520 releases a scoreboard associated with the multiple memory transactions, indicating that all data is returned. At step 1014, WB 520 writes the received data to RF 328. Alternatively, WB 520 may write data back to SM 310 incrementally as the data is returned.

Figure 11:
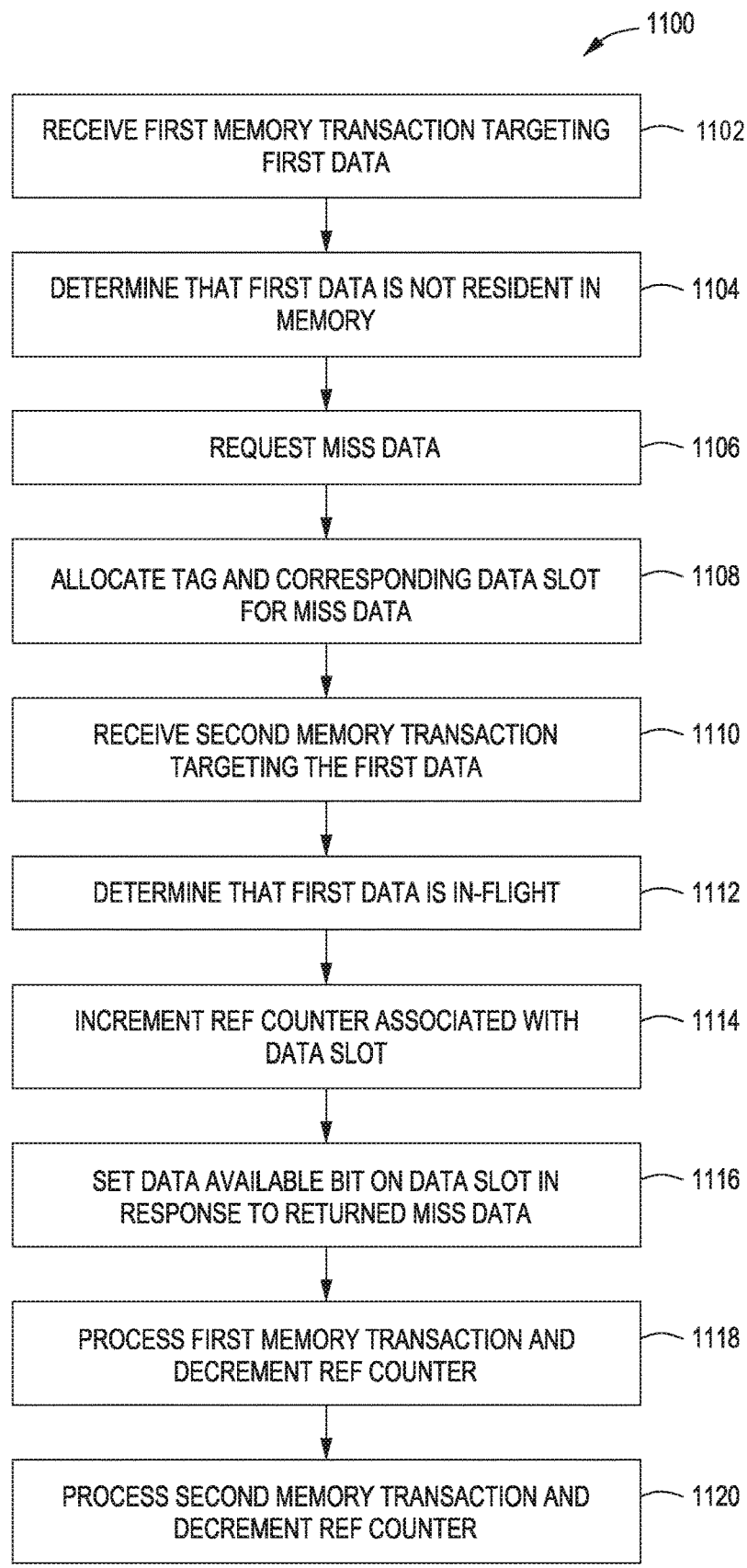
FIG. 11 is a flow diagram of method steps for tracking the number of memory transactions that target a particular memory location within a unified cache, according to various embodiments of the present invention.

FIG. 11 is a flow diagram of method steps for tracking the number of memory transactions that target a particular memory location within a unified cache, according to various embodiment of the present invention. Although the method steps are described in conjunction with the system of FIGS. 1-8, persons skilled in the art will understand that any system configured to perform the method steps, in any order, falls within the scope of the present invention.

As shown, a method 1100 begins at step 1102, where tag processor 416 within tag pipeline 410 receives a memory transaction targeting first data. At step 1104, tag processor 416 scans tag memory 414 and determines that a tag referencing the first data is not resident (a cache miss occurs). At step 1106 m-stage 426 requests the miss data from external memory. At step 1108, tag processor 416 allocates a tag within tag memory 414 and a corresponding data slot within data memory 430 for the returning in-flight miss data. In doing so, tag processor 416 initializes the ref counter of the data slot to 2, indicating that both the allocated tag and the first memory transaction reference the data slot. Tag processor 416 also initializes the data present bit to 0, indicating that the miss data has not yet returned.

At step 1110, tag processor 416 receives a second memory transaction that references the first data. Although a tag for the first data exists, tag processor 416 may not determine that a cache hit occurs because the first data not yet available (the data present bit is zero). This situation is referred to as a "hit on miss." At step 1112, tag processor 416 determines that the first data is still in flight, and then at step 1114 increments the ref counter associated with the data slot allocated at step 1108.

At step 1116 the miss data is returned and, in response, m-stage 426 sets the data present bit of the data slot to 1. At step 1118, data memory 430 services the first memory transaction and decrements the ref counter. At step 1120, data memory 430 services the second memory transaction and decrements the ref counter. If the tag allocated at step 1108 still resides in tag memory 414, the ref counter may have a value of 1. However, when the tag is evicted and the ref counter decremented to zero, the data slot is freed.

Figure 12:
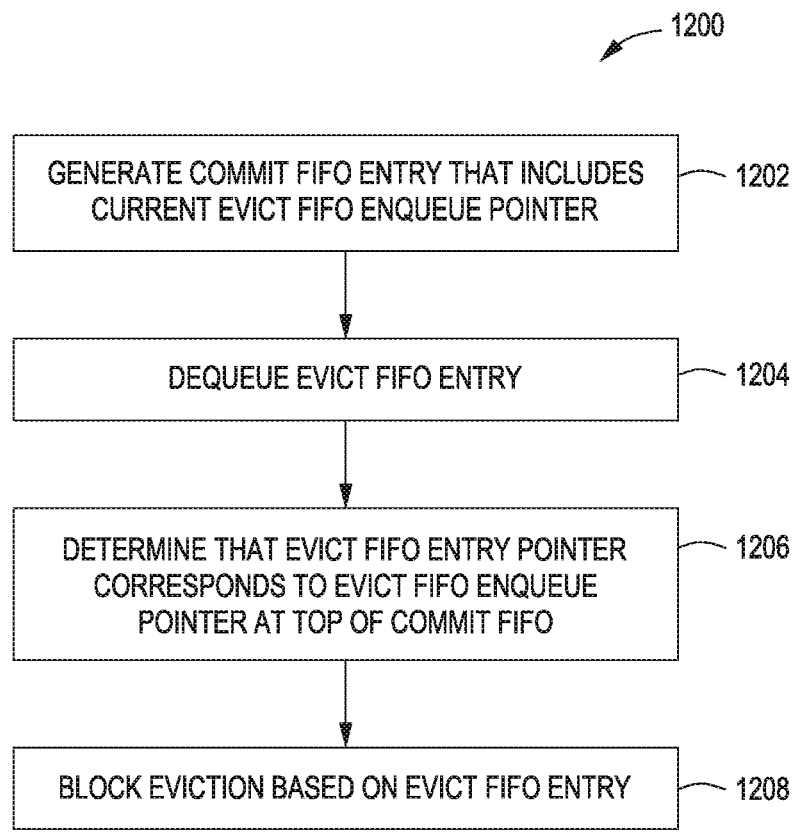
FIG. 12 is a flow diagram of method steps for blocking a cache line from being evicted from a unified cache, according to various embodiments of the present invention.

FIG. 12 is a flow diagram of method steps for blocking a cache line from being evicted from a unified cache, according to various embodiment of the present invention. Although the method steps are described in conjunction with the system of FIGS. 1-8, persons skilled in the art will understand that any system configured to perform the method steps, in any order, falls within the scope of the present invention.

As shown, a method 1200 begins at step 1202, where Tag processor 416 receives a load hit request and, in response, generates an entry for commit FIFO 422 that includes the current enqueue pointer for evict FIFO 424. At step 1204, evict FIFO 424 dequeues an eviction entry. At step 1206, evict FIFO 424 determines that the enqueue pointer associated with the dequeued entry corresponds to the evict FIFO enqueue pointer stored at the topmost entry of commit FIFO 422. This particular situation indicates that data associated with a memory transaction tracked by commit FIFO 422 is not yet completely committed, and therefore should not be evicted. At step 1208, evict FIFO 424 blocks the eviction based on the evict FIFO entry and stalls until the commit FIFO entry is dequeued.

Figure 13:
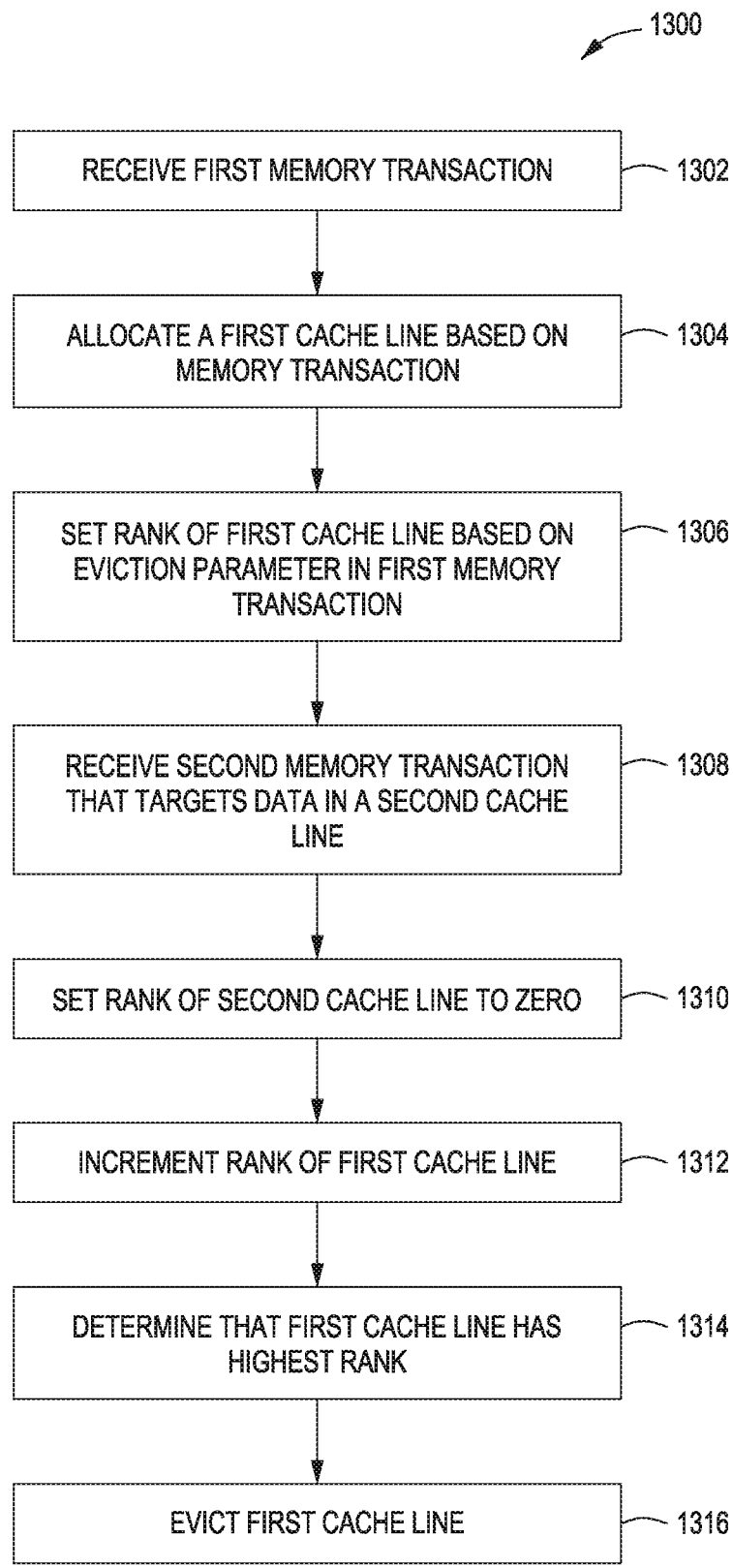
FIG. 13 is a flow diagram of method steps for evicting a cache line from a unified cache, according to various embodiments of the present invention.

FIG. 13 is a flow diagram of method steps for evicting a cache line from a unified cache, according to various embodiment of the present invention. Although the method steps are described in conjunction with the system of FIGS. 1-8, persons skilled in the art will understand that any system configured to perform the method steps, in any order, falls within the scope of the present invention.

As shown, a method 1300 begins at step 1302, where data memory 430 receives a first memory transaction. At step 1304, data memory 430 allocates a first cache line based on the memory transaction. In operation, data memory 430 allocates the first cache line based on tag processor 416 allocating a tag corresponding to data targeted by the first memory transaction. At step 1306, data memory 430 sets the rank of the first cache line based on an eviction parameter associated with the first memory transaction. The eviction parameter is a default rank that may be assigned by an application programmer.

At step 1308, data memory 430 receives a second memory transaction that targets data in a second cache line in the same cache set. At step 1310, data memory 430 sets the rank of the second cache line to zero, indicating that the cache line has a low priority for eviction. At step 1312, data memory 430 increments the rank of the first cache line. At step 1314, data memory 430 determines that the first cache line has the highest rank compared to the second cache line, and at step 1316, tag pipeline 410 evicts the first cache line.

Unified cache 316 discussed thus far operates with particular characteristics that allow many different types of memory clients to efficiently store and retrieve data. In addition, unified cache 316 implements a certain maintenance hardware that maintains sufficient free data slots, allows dynamic cache resisting, and facilitates single-cycle class based invalidation, as described in greater detail below in conjunction with FIGS. 14-17.

Managing Cache Resources

Figure 14:
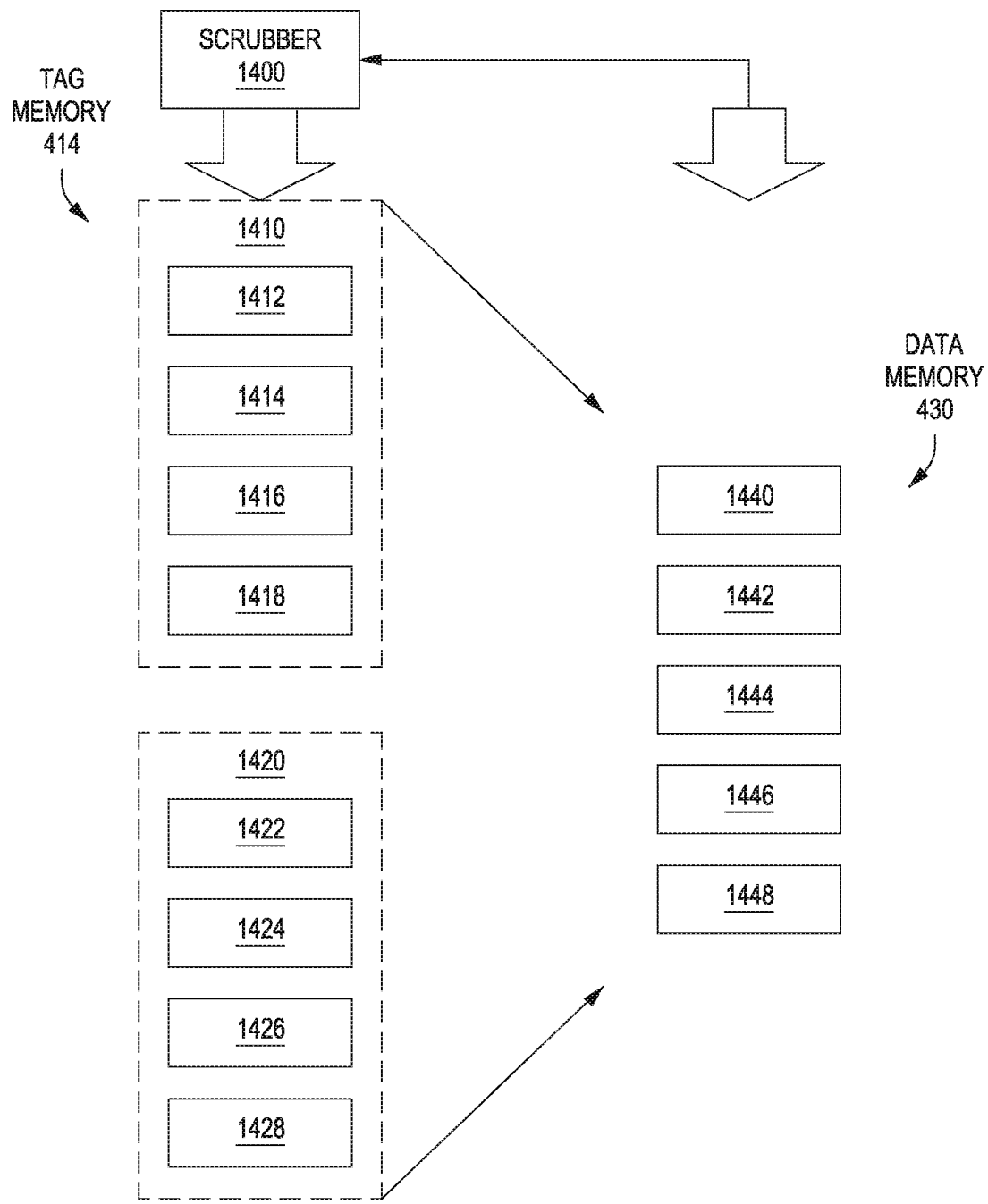
FIG. 14 is a block diagram of a scrubber that frees data slots within the unified cache of FIG. 4, according to various embodiments of the present invention.

FIG. 14 is a block diagram of a scrubber that frees data slots within the unified cache of FIG. 4, according to various embodiment of the present invention. Scrubber 1400 is a configurable hardware unit included within unified cache 316 of FIG. 4. As shown, tag memory 414 includes sets 1410 and 1420 of tags. Set 1410 includes tags 1412, 1414, 146, and 1418 and set 1420 includes tags 1412, 1414, 146, and 1418. Tags in sets 1410 and 1420 map to data slots 1440, 1442, 1444, 1446, and 1448 within data memory 430.

Scrubber 1400 is configured to manage the availability of data slots in data memory 430. Specifically, scrubber 1400 maintains the availability of data slots above a threshold level. When the number of available data slots falls beneath the threshold level, scrubber 1400 then accesses tag memory 410 and evicts one or more tags. In doing so, scrubber 1400 scans sets 1410 and 1420 and selects a particular set. Then scrubber 1400 scans the selected set and identifies a tag corresponding to a data slot. Scrubber 1400 evicts the tag to free the data slot. The tag may correspond, for example, to the least recently used data slot referenced by the set.

Tag memory 410 is decoupled from data memory 430. Thus, a newly allocated tag may map to any region of data memory 430. Accordingly, scrubber 1400 may select tags for eviction from any set in order to free a data slot for the newly allocated tag, regardless of where the newly allocated tag resides. With this approach, scrubber 1400 continuously maintains sufficient available data slots in data memory 430. In addition, because tag memory 410 is decoupled from data memory 430, scrubber 1400 may help support dynamic cache resizing to adjust the amount of data memory 430 dedicated to shared memory versus that allocated to cache memory. Generally, tags in tag memory 410 may reference any size data slot, unlike conventional designs.

In one embodiment, to resize data memory 430, scrubber 1400 evicts a collection of tags to shrink cache memory or allocates a number of tags to expand cache memory. In another embodiment, cache resizing occurs when SM 310 is idle and tagged data slots in unified cache 316 are all invalidated. Among other things, this approach provides contiguous data allocation for shared memory. Scrubber is also configured to implement class-based invalidation, as described in greater detail below in conjunction with FIG. 15.

Figure 15:
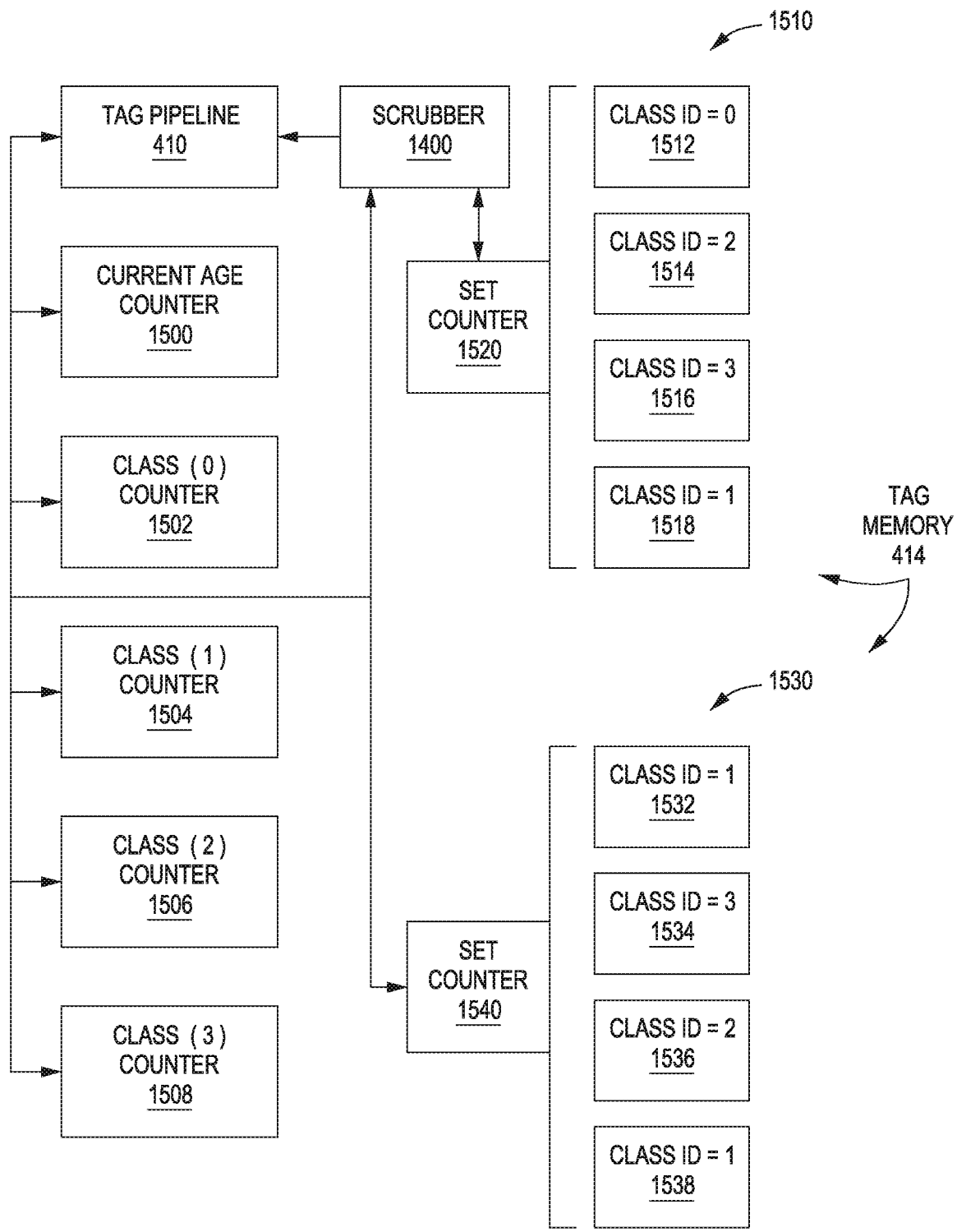
FIG. 15 is a block diagram of how data slots are freed within the unified cache of FIG. 4 based on a class of data to invalidate, according to various embodiments of the present invention.

FIG. 15 is a block diagram of how data slots are freed within the unified cache of FIG. 4 based on a class of data to invalidate, according to various embodiment of the present invention. As shown, tag pipeline 410 is coupled to a collection of counters, including current age counter 1500, class (0) counter 1502, class (1) counter 1504, class (2) counter 1506, and class (3) counter 1508. Current age counter 1500 tracks a current age value.

The various class counters track the age associated with different classes of data. A class of data could be, for example, texture data, or global memory data, or surface data, among others. Class (0) counter 1502 tracks the age of data having class 0, class (1) counter 1504 tracks the age of data having class 1, class (2) counter 1506 tracks the age of data having class 2, and class (3) counter 1508 tracks the age of data having class 3.

Tag pipeline 410 is also coupled to tag memory 410 and configured to access sets 1510 and 1530 of tags stored in tag memory 414. Set 1510 includes tags 1512, 1514, 1516, and 1518, and is associated with a set counter 1520. Tag 1512 references data of class 0, tag 1514 references data of class 2, tag 1516 references data of class 3, and tag 1518 references data of class 1. Set 1530 includes tags 1532, 1534, 1536, and 1538, and is associated with a set counter 1540. Tag 1532 references data of class 1, tag 1534 references data of class 3, tag 1536 references data of class 2, and tag 1538 references data of class 1.

Tag pipeline 410 is configured to invalidate certain classes of data based on the various age counters discussed above in response to receiving an invalidation request that targets a particular class. When tag pipeline 410 receives an invalidation request, tag pipeline 410 increments current age counter 1500 and then identifies the class counter corresponding to the class to invalidate. Tag pipeline 410 then sets the age of the identified class counter equal to the value of current age counter 1500.

Subsequently, during any access to a particular tag in a given set, tag pipeline 410 determines if the class counter associated with the data referenced by the tag exceeds (or is older than) the set counter associated with the given set. If the class counter does exceed the set counter, then tag pipeline 410 invalidates the tag and the corresponding data is evicted. Tag pipeline 410 then updates the set counter to equal current age counter 1500.

For example, suppose tag pipeline 410 receives a request to invalidate data having class 0. Tag pipeline 410 increments the age of current age counter 1500 to N, where N is some integer, and then sets the value of class (0) counter 1502 to N. Later, during access to tag 1512, tag pipeline 410 compares the value of set counter 1520 to current age counter 1500 and determines that the value of class (0) counter 1502 (N) exceeds that of set counter 1520. Tag pipeline 410 then invalidates tag 1512 and updates set counter 1520 to N.

When the values of current age counter 1500 saturates, scrubber 1400 may reset the class counters as well as the set counters and begin the incrementing process again. In doing so, scrubber 1400 may perform a "saturation scrub" whereby, for each tag in each set, scrubber 1400 determines if the class counter associated with the data referenced by the tag exceeds the set counter associated with the given set. If the class counter does exceed the set counter, then scrubber 1400 invalidates the tag and the corresponding data is evicted. Scrubber 1400 then updates the set counter to equal current age counter 1500. Scrubber 1400 may execute the saturation scrub opportunistically by inserting additional tag requests into tag pipeline 410 during bubbles in the pipeline, or may stall tag pipeline 410 in order to expedite the saturation scrub.

With the above approach, tag pipeline 410 may track, via the different counters, multiple different invalidations. In addition, this approach allows tag pipeline 410 and scrubber 1400 to invalidate many different classes in a single cycle, which may be desirable for backwards compatibility.

Figure 16:
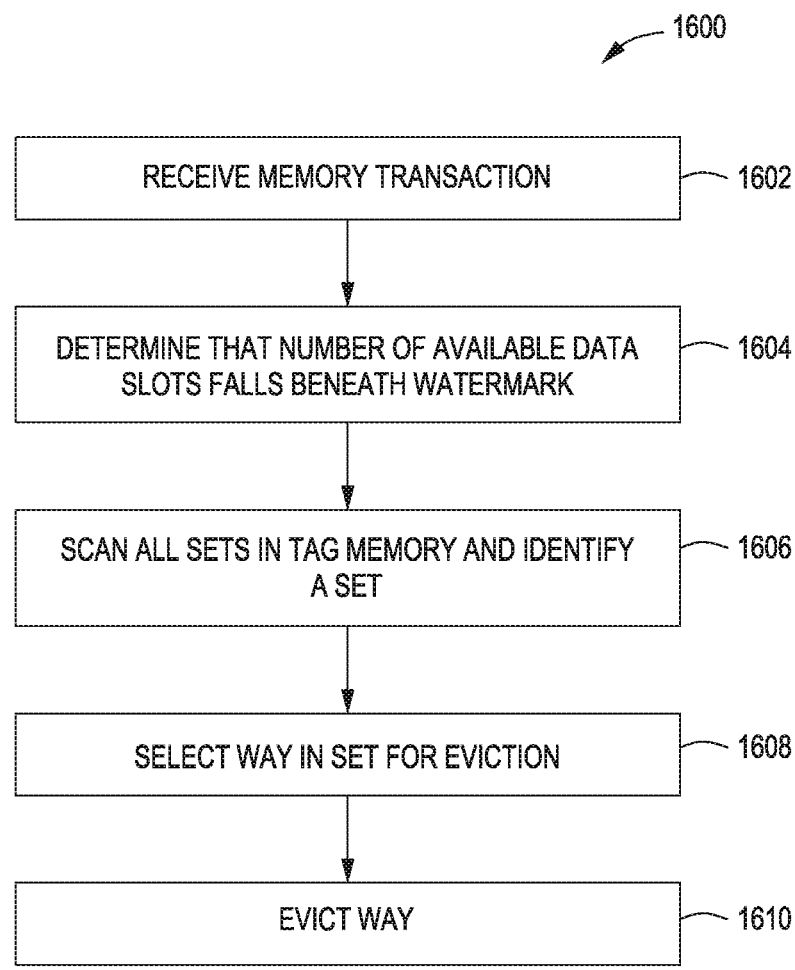
FIG. 16 is a flow diagram of method steps for freeing a data slot within a data memory of a unified cache, according to various embodiments of the present invention.

FIG. 16 is a flow diagram of method steps for freeing a data slot within a data memory of a unified cache, according to various embodiment of the present invention. Although the method steps are described in conjunction with the system of FIGS. 1-4 and 14-15, persons skilled in the art will understand that any system configured to perform the method steps, in any order, falls within the scope of the present invention.

As shown, a method 1600 begins at step 1602, where scrubber 1400 receives a store-type memory transaction. At step 1604, scrubber 1400 determines that the number of available data slots in data memory 430 has fallen beneath a watermark or threshold value, meaning that data memory 430 may not have sufficient data slots to accommodate the memory transaction. At step 1606, scrubber 1400 scans all tags in tag memory 414 and identifies a set. Scrubber 1400 then selects a particular way in the set and, at step 1610, scrubber 1400 evicts the way. Scrubber 1400 implements the method 1600 to maintain free data blocks and also to perform dynamic cache resizing.

Figure 17:
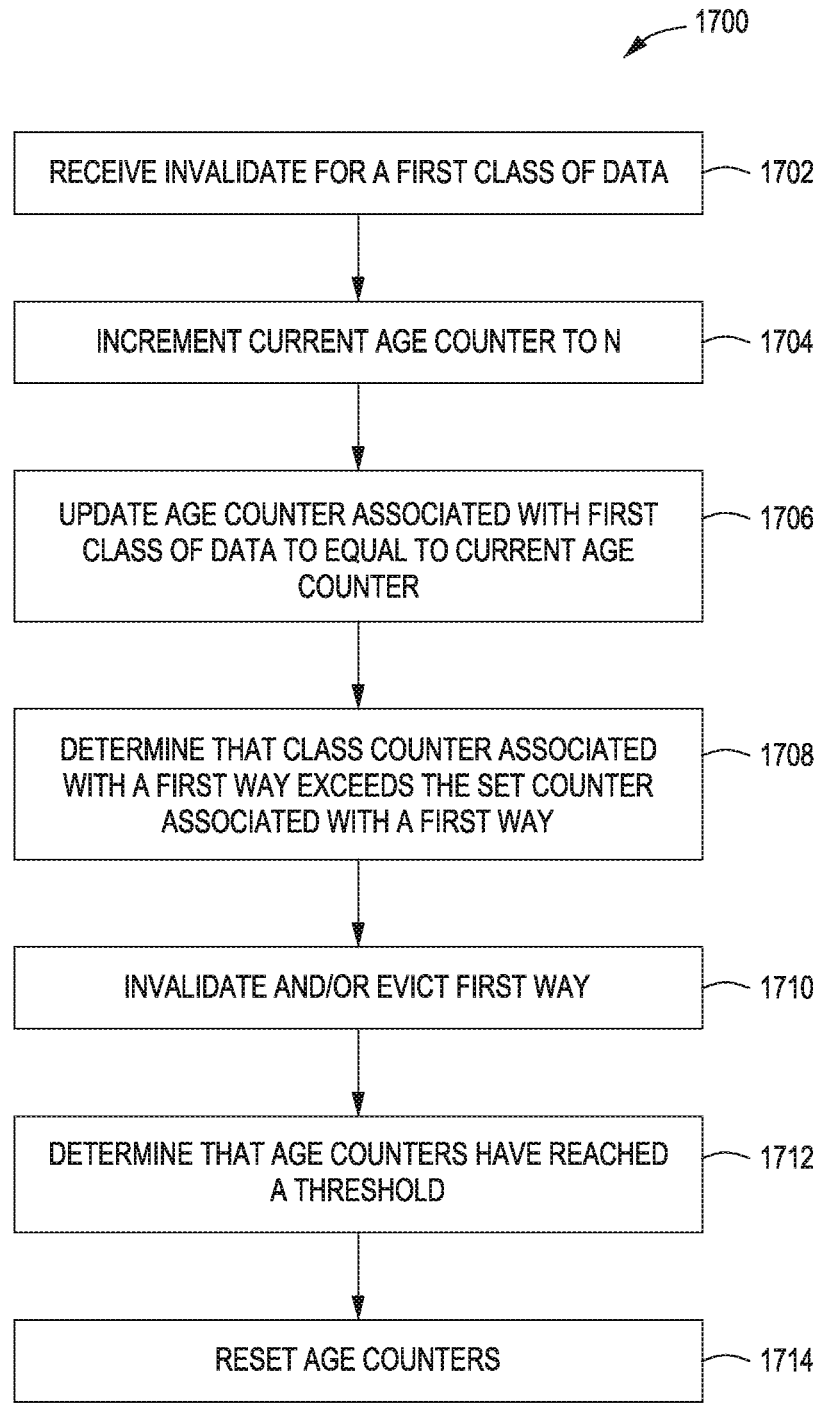
FIG. 17 is a flow diagram of method steps for freeing a data slot that corresponds to a particular data class, according to various embodiments of the present invention.

FIG. 17 is a flow diagram of method steps for freeing a data slot that corresponds to a particular data class, according to various embodiment of the present invention. Although the method steps are described in conjunction with the system of FIGS. 1-4 and 14-15, persons skilled in the art will understand that any system configured to perform the method steps, in any order, falls within the scope of the present invention.

As shown, a method 1700 begins at step 1702, where tag pipeline 410 receives an invalidation request for a first class of data. At step 1704, tag pipeline 410 increments current age counter 1500 to N. At step 1706, tag pipeline 410 updates a counter associated with the first class of data to equal N. The counter could be, for example, class (0) counter 1502.

Later, during a memory access for a first way, tag pipeline 410 determines, at step 1708, that the class counter associated with the first way exceeds the set counter associated with the set that includes the way. At step 1710, tag pipeline 410 invalidates and/or evicts the first way. At step 1712, tag pipeline 410 determines that the current age counter has saturated. At step 1714, scrubber 1400 resets the age counters. In doing so, scrubber 1400 may implement the saturation scrub described above in conjunction with FIG. 15.

In sum, a unified cache subsystem includes a data memory configured as both a shared (scratchpad) memory and a tagged local cache memory. The unified cache subsystem processes different types of memory transactions using different data pathways. To process memory transactions that target shared memory, the unified cache subsystem includes a direct pathway to the data memory. To process memory transactions that target local/global memory, the unified cache subsystem includes a tag processing pipeline configured to identify cache hits and cache misses. When the tag processing pipeline identifies a cache hit for a given memory transaction, the transaction is rerouted to the direct pathway to data memory. When the tag processing pipeline identifies a cache miss or hit on miss for a given memory transaction, the transaction is pushed into a first-in first-out (FIFO) until miss data is returned from external memory. The tag processing pipeline is also configured to process texture-oriented memory transactions received from a texture processing pipeline. Data is read from the data memory via a crossbar that is shared between the processing core and the texture processing pipeline.

Thus, the unified cache unifies the functionalities of shared memory, L1 cache, and texture cache into a single data memory. The shared memory aspect of the unified cache provides high bandwidth and low latency, while the L1 and texture cache aspects of the unified cache offer streaming capabilities and rely on a unified tag memory.

One advantage of the unified cache subsystem is that the tag processing pipeline includes just one tag store that is utilized when processing global memory operations and when processing texture memory operations. Thus, the duplicate tag store found in prior art designs is eliminated. Another advantage of the unified cache subsystem is that the data memory includes only one crossbar for reading out data, compared to two crossbars required by prior designs. Yet another advantage of the unified cache subsystem is that the tag processing pipeline performs memory address generation. Thus, memory transactions targeting global memory need not traverse the entire texture processing pipeline to perform those address calculations.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

The claimed invention is:

1. A memory subsystem, comprising:
   a first memory;
   a first data pathway that services first-type memory transactions and provides direct access to the first memory; and
   a second data pathway that services second-type memory transactions of a first sub-type and second-type memory transactions of a second sub-type and includes:
      a first data sub-pathway that is coupled to the first data pathway and transports second-type memory transactions of the first sub-type to the first data pathway when a first condition occurs, and
      a second data sub-pathway that is coupled to the first memory and services second-type memory transactions of the second sub-type.

2. The memory subsystem of claim 1, wherein the first memory comprises:
   a first sub-bank coupled to the first data pathway and to the first data sub-pathway, wherein the first sub-bank comprises a scratchpad memory for servicing first-type memory transactions and a cache memory for servicing second-type memory transactions of the first sub-type; and a second sub-bank coupled to the second data sub-pathway, wherein the second sub-bank comprises a texture cache for servicing second-type memory transactions of the second sub-type.

3. The memory subsystem of claim 1, further comprising:
a tag processing pipeline coupled to the second data pathway and including:
  a tag processor;
  a tag-to-data (T2D) first-in first-out (FIFO) buffer coupled to the second data pathway; and
  a tag store that includes a plurality of tags, wherein a first tag included in the plurality of tags indicates that a first data slot included in the first memory includes a first portion of data.

4. The memory subsystem of claim 3, wherein the tag processor determines that the first condition has occurred and, in response, directs a first memory transaction to the first data pathway, the first condition comprises the first portion of data being resident in the first memory, and the first memory transaction is configured to access first portion of data.

5. The memory subsystem of claim 3, wherein the tag processor determines that a second condition has occurred and, in response, pushes a first memory transaction onto the T2D FIFO buffer, the second condition comprises at least one of the first portion of data not being resident in the first memory and the first portion of data being in-flight to the first memory, and the first memory transaction is configured to access the first portion of data.

6. The memory subsystem of claim 3, wherein the tag processor processes a first memory transaction that is configured to access the first portion of data by:
  incrementing a first reference counter associated with the first memory transaction to prevent the first portion of data from being evicted from the first data slot;
  accessing the first portion of data to service the first memory transaction;
  decrementing the first reference counter.

7. The memory subsystem of claim 6, wherein the tag processor processes a second memory transaction that is configured to access a second portion of data by:
  evicting the first tag upon receiving the second memory transaction;
  decrementing the first reference counter to zero to allow the first portion of data to be evicted from the first data slot;
  evicting the first portion of data from the first data slot to allow the second portion of data to be stored in the first data slot.

8. The memory subsystem of claim 3, wherein the tag processing pipeline further includes:
  a commit FIFO that stores a first memory transaction that is configured to access the first portion of data;
  an evict FIFO that stores a first evict transaction associated with the first portion of data,
  wherein the tag processing pipeline prevents the first portion of data from being evicted by the first data slot by:
    dequeueing the first evict transaction from the evict FIFO,
    determining that a first enqueue pointer associated with the first evict transaction matches an index associated with the first memory transaction that is stored in the commit FIFO, and
    stalling execution of the first evict transaction.

9. The memory subsystem of claim 3, wherein the tag processing pipeline processes second-type memory transactions by:
  receiving a first memory transaction that is configured to access the first portion of data and is of the first sub-type;
  servicing the first memory transaction;
  setting a first rank associated with the first data slot to a first value corresponding to the first sub-type;
  receiving a second memory transaction that is configured to access a second portion of data included in a second data slot and is of the second sub-type;
  servicing the second memory transaction; and
  setting a second rank associated with the second data slot to a second value corresponding to the second sub-type, wherein the second value exceeds the first value and indicates that the second data slot has a higher priority for eviction than the first data slot.

10. The memory subsystem of claim 9, wherein the tag processing pipeline further processes second-type memory transactions by:
  receiving a third memory transaction targeting the second portion of data;
  servicing the third memory transaction;
  incrementing the first rank;
  setting the second rank to zero; and
  evicting the first portion of data from the first data slot based on the first rank exceeding the second rank.

11. The memory subsystem of claim 1, further comprising a write-back buffer that:
  receives a first subset of load data that traverses the first data sub-pathway and is associated with a first latency;
  receives a second subset of load data that traverses the second data sub-pathway and is associated with a second latency;
  receives a token associated with the second subset of load data, wherein the token indicates that all subsets of load data have been received; and
  upon receiving the token, writes the load data back to a processor.

12. A computer-implemented method for servicing memory transactions, the method comprising:
  receiving a first memory transaction;
  determining a type associated with the first memory transaction;
  when the first memory transaction has a first type, routing the first memory transaction across a first data pathway that provides direct access to a first memory; and
  when the first memory transaction has a second type:
    routing the first memory transaction across a second data pathway that includes a first data sub-pathway and a second data sub-pathway,
    determining a sub-type associated with the first memory transaction, and
    routing the first memory transaction across one of the first data sub-pathway and the second data sub-pathway based on the sub-type.

13. The computer-implemented method of claim 12, further comprising:
  routing the second-type memory transaction across the first data sub-pathway when the second-type memory transaction has the first sub-type, wherein the first data sub-pathway transports memory transactions associated with the second type and the first sub-type to the first data pathway when a first condition occurs, or routing the second-type memory transaction across the second data sub-pathway when the second-type memory transaction has the second sub-type, wherein the second data sub-pathway transports memory transactions associated with the second type and the second sub-type when a second condition occurs.

14. The computer-implemented method of claim 13, further comprising:
determining that the first condition has occurred; and
in response, directing the first memory transaction to the first data pathway, the second condition comprising a first portion of data being resident in the first memory and wherein the first memory transaction is configured to access the first portion of data.

15. The computer-implemented method of claim 13, further comprising:
determining that the second condition has occurred; and
in response, pushing the first memory transaction onto a buffer, the second condition comprising at least one of a first portion of data not being resident in the first memory and the first portion of data being in-flight to the first memory, wherein the first memory transaction is configured to access the first portion of data.

16. The computer-implemented method of claim 12, further comprising:
incrementing a first reference counter associated with the first memory transaction to prevent a first portion of data associated with the first memory transaction from being evicted from a first data slot;
accessing the first portion of data to service the first memory transaction; and
decrementing the first reference counter.

17. The computer-implemented method of claim 16, further comprising:
evicting a first tag upon receiving a second memory transaction;
decrementing the first reference counter to zero to allow the first portion of data to be evicted from the first data slot; and
evicting the first portion of data from the first data slot to allow a second portion of data associated with the second memory transaction to be stored in the first data slot.

18. The computer-implemented method of claim 12, further comprising:
determining that the first memory transaction is associated with the first sub-type;
accessing a first portion of data residing in a first data slot to service the first memory transaction;
setting a first rank associated with the first data slot to a first value corresponding to the first sub-type;
receiving a second memory transaction that is configured to access a second portion of data included in a second data slot and is of the second sub-type;
servicing the second memory transaction; and
setting a second rank associated with the second data slot to a second value corresponding to the second sub-type, wherein the second value exceeds the first value and indicates that the second data slot has a higher priority for eviction than the first data slot.

19. The computer implemented method of claim 18, further comprising:
receiving a third memory transaction targeting the second portion of data;
servicing the third memory transaction;
incrementing the first rank;
setting the second rank to zero; and
evicting the first portion of data from the first data slot based on the first rank exceeding the second rank.

20. A system, comprising:
a streaming multiprocessor that generates memory transactions; and
a unified cache coupled to the processor and servicing the memory transactions by performing the steps of:
receiving a first memory transaction,
determining a type associated with the first memory transaction,
when the first memory transaction has a first type, routing the first memory transaction across a first data pathway that provides direct access to a first memory, and
when the first memory transaction has a second type:
routing the first memory transaction across a second data pathway that includes a first data sub-pathway and a second data sub-pathway,
determining a sub-type associated with the first memory transaction, and
when the second-type memory transaction has the first sub-type and a first condition occurs, routing the second-type memory transaction across the first data sub-pathway, or
when the second-type memory transaction has the second sub-type and a second condition occurs, routing the second-type memory transaction across the second data sub-pathway.

* * * * *